US012113371B2

(12) United States Patent
Bhandarkar et al.

(10) Patent No.: US 12,113,371 B2
(45) Date of Patent: *Oct. 8, 2024

(54) LOW POWER OBJECT DETECTION IN MULTI-COIL WIRELESS CHARGING SYSTEMS AND RELATED SYSTEMS, METHODS, AND DEVICES

(71) Applicant: Microchip Technology Incorporated, Chandler, AZ (US)

(72) Inventors: Santosh Bhandarkar, Chandler, AZ (US); Alex Dumais, Boise, ID (US)

(73) Assignee: Microchip Technology, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/186,837

(22) Filed: Mar. 20, 2023

(65) Prior Publication Data

US 2023/0231420 A1    Jul. 20, 2023

Related U.S. Application Data

(63) Continuation of application No. 17/451,673, filed on Oct. 21, 2021, now Pat. No. 11,611,243, which is a
(Continued)

(51) Int. Cl.
*H02J 50/60* (2016.01)
*G01R 27/26* (2006.01)
(Continued)

(52) U.S. Cl.
CPC .......... *H02J 50/60* (2016.02); *G01R 27/2611* (2013.01); *H02J 50/12* (2016.02); *H02J 50/402* (2020.01)

(58) Field of Classification Search
CPC .. H02J 5/005; H02J 7/025; H02J 50/12; H02J 50/402; H02J 50/60
See application file for complete search history.

(56) References Cited

U.S. PATENT DOCUMENTS 9,130,395 B2   9/2015 Jung
2010/0219796 A1   9/2010 Kallmyer
(Continued)

FOREIGN PATENT DOCUMENTS

CN   108702179 A   10/2018
CN   110121665 A   8/2019
(Continued)

OTHER PUBLICATIONS

"The Qi Wireless Power Transfer System Power Class 0 Specification," Part 4: Reference Designs, Version 1.2.4, Qi Wireless Power Consortium, Feb. 2018, 363 pages.
(Continued)

*Primary Examiner* — Levi Gannon
(74) *Attorney, Agent, or Firm* — TraskBritt

(57) ABSTRACT

Object detection for wireless power transmitters and related systems, methods, and devices are disclosed. A controller for a wireless power transmitter is configured to receive a measurement voltage potential responsive to a tank circuit signal at a tank circuit, provide an alternating current (AC) signal to each of the plurality of transmit coils one at a time, and determine at least one of a resonant frequency and a quality factor (Q-factor) of the tank circuit responsive to each selected transmit coil of the plurality of transmit coils. The controller is also configured to select a transmit coil to use to transmit wireless power to a receive coil of a wireless power receiver responsive to the determined at least one of the resonant frequency and the Q-factor for each transmit coil of the plurality of transmit coils.

20 Claims, 10 Drawing Sheets

Related U.S. Application Data continuation of application No. 16/863,865, filed on Apr. 30, 2020, now Pat. No. 11,159,062.

(60) Provisional application No. 62/984,722, filed on Mar. 3, 2020.

(51) Int. Cl.
*H02J 50/12* (2016.01)
*H02J 50/40* (2016.01)

(56) References Cited

U.S. PATENT DOCUMENTS

| | | |
|---|---|---|
| 2012/0139356 A1 | 6/2012 | Jung et al. |
| 2012/0175967 A1 | 7/2012 | Dibben et al. |
| 2012/0242163 A1 | 9/2012 | Jung et al. |
| 2013/0257167 A1 | 10/2013 | Singh |
| 2014/0077617 A1 | 3/2014 | Nakano et al. |
| 2016/0043567 A1 | 2/2016 | Matsumoto et al. |
| 2016/0121732 A1 | 5/2016 | Matsumoto et al. |
| 2016/0164302 A1 | 6/2016 | Nakano et al. |
| 2017/0005518 A1 | 1/2017 | Jung |
| 2017/0093224 A1 | 3/2017 | Park et al. |
| 2017/0117755 A1 | 4/2017 | Muratov et al. |
| 2017/0117756 A1 | 4/2017 | Muratov |
| 2017/0149287 A1 | 5/2017 | Nakano et al. |
| 2017/0366048 A1 | 12/2017 | Watanabe et al. |
| 2018/0115197 A1 | 4/2018 | Li et al. |
| 2018/0131235 A1 | 5/2018 | Inoue et al. |
| 2018/0131243 A1 | 5/2018 | Hamaguchi et al. |
| 2018/0219431 A1 | 8/2018 | Guillermo et al. |
| 2019/0104569 A1 | 4/2019 | Moon et al. |
| 2019/0131826 A1 | 5/2019 | Park et al. |
| 2019/0238000 A1 | 8/2019 | Salvekar et al. |
| 2019/0296590 A1 | 9/2019 | Chae |
| 2019/0312466 A1 | 10/2019 | Mynar et al. |
| 2019/0312467 A1 | 10/2019 | Mynar et al. |
| 2019/0319495 A1 | 10/2019 | Park |
| 2019/0393732 A1 | 12/2019 | Oshima et al. |
| 2020/0169123 A1 | 5/2020 | Mehas et al. |
| 2020/0274396 A1 | 8/2020 | Smith |
| 2021/0203193 A1 | 7/2021 | Kim et al. |
| 2021/0273492 A1 | 9/2021 | Sherman et al. |

FOREIGN PATENT DOCUMENTS

| | | |
|---|---|---|
| CN | 110168900 A | 8/2019 |
| CN | 110249501 A | 9/2019 |
| CN | 110268598 A | 9/2019 |
| CN | 110692177 A | 1/2020 |
| WO | 2018/104068 A1 | 6/2018 |
| WO | 2018/222287 A1 | 12/2018 |
| WO | 2020/003314 A1 | 1/2020 |
| WO | 2020/015746 A1 | 1/2020 |

OTHER PUBLICATIONS

International Search Report for International Application No. PCT/US2020/030825, dated Oct. 19, 2020, 4 pages.

International Written Opinion for International Application No. PCT/US2020/030825, mailed Oct. 19, 2020, 11 pages.

Chinese First Office Action for Chinese Application No. 2020800980272, dated Apr. 28, 2023, 18 pages with English translation.

International Search Report from International Application No. PCT/US2020/070635, mailed Dec. 15, 2020, 5 pages.

International Written Opinion from International Application No. PCT/US2020/070635, mailed Dec. 15, 2020, 11 pages.

Notification to Grant Patent Right for Invention and Search Report of Chinese Patent Application No. 202080098027.2, issued Jan. 13, 2024, 7 pages with English translation.

LOW POWER OBJECT DETECTION IN MULTI-COIL WIRELESS CHARGING SYSTEMS AND RELATED SYSTEMS, METHODS, AND DEVICES

CROSS-REFERENCE TO RELATED APPLICATIONS

This application is a continuation of U.S. patent application Ser. No. 17/451,673, filed Oct. 21, 2021, now U.S. Pat. No. 11,611,243, issued Mar. 21, 2023, which is a continuation of U.S. patent application Ser. No. 16/863,865, filed Apr. 30, 2020, now U.S. Pat. No. 11,159,062, issued Oct. 26, 2021, which claims the benefit under 35 U.S.C. § 119(e) of U.S. Provisional Patent Application Ser. No. 62/984,722, filed Mar. 3, 2020, and titled "LOW POWER OBJECT DETECTION IN MULTI-COIL WIRELESS CHARGING SYSTEMS AND RELATED SYSTEMS, METHODS, AND DEVICES," the entire disclosure of each of which is hereby incorporated herein by reference.

TECHNICAL FIELD

The disclosure relates generally to wireless power transfer, and more specifically to low power object detection in multi-coil wireless power transmitters.

BACKGROUND

Wireless power transfer systems may transfer power from one electronic device to another electronic device. More specifically, a transmitter of a transmitting device may generate an electromagnetic field, and a receiver of a receiving device may extract power from the electromagnetic field.

BRIEF DESCRIPTION OF THE SEVERAL VIEWS OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
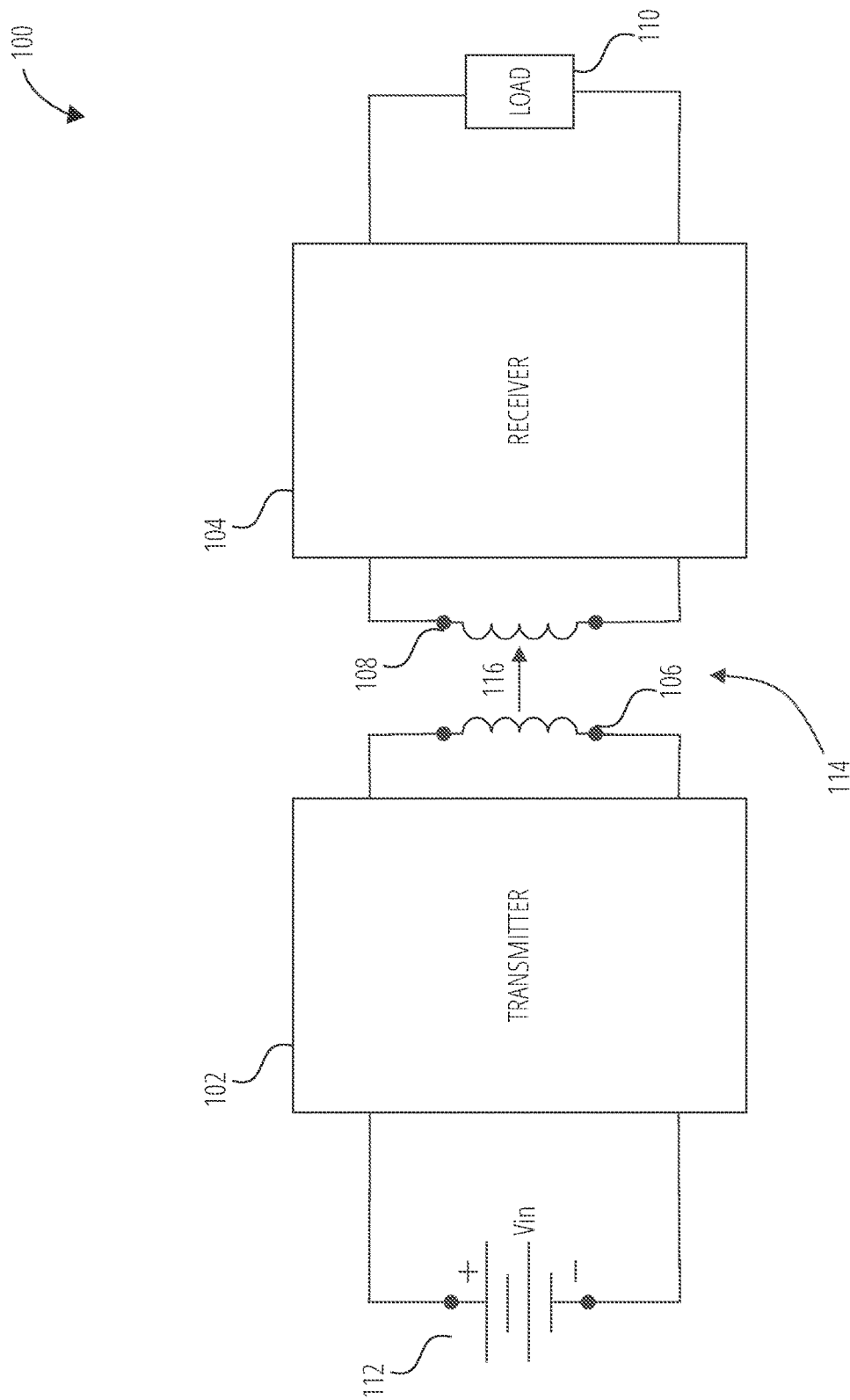
FIG. 1 is a block diagram of a wireless power system, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawing could be arranged and designed in a wide variety of different configurations. Thus, the following description of various embodiments is not intended to limit the scope of the present disclosure, but is merely representative of various embodiments. While the various aspects of the embodiments may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, etc. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

Wireless power transfer techniques are used to transfer power from one system to another in a wide range of applications. Qi is a widely adopted wireless charging standard and it has proliferated into consumer cellular telephone brands.

By way of example, a Qi wireless system includes a transmitter and a receiver. The transmitter controls the power transferred to the receiver based on feedback received from the receiver. The transmitter includes at least one coil with which the receiver coil is coupled in a wireless system. In a multi-coil transmitter design, there are multiple transmitter coils overlapping each other so that the receiver coil can be placed proximate to any of the transmitter coils. This provides spatial freedom for receiver placement and ensures power transfer even with mere approximate placement of the receiver coil proximate to the transmitter. In contrast, single coil transmitters require that the receiver coil be properly aligned with the transmitter coil for power transfer.

One of the functions of the transmitter is to detect the presence of a receiver proximate to its coil. The Qi specification recommends using two methods for receiver detection, namely: (1) analog ping and (2) digital ping. These methods excite the tank circuit with a voltage potential known as a ping voltage, and measure either the current in analog ping or receiver communication in digital ping to detect the receiver. This is done periodically to check if a receiver is present. Both these methods, however, consume relatively large amounts of power, which could be an issue with battery powered transmitters. In addition, both of these methods fail to identify the presence of foreign objects, as differentiated from a receiver, proximate to the transmitter. If left undetected, a foreign object may cause the transmitter to treat the foreign object as part of a receiver, which may lead to incorrect power loss calibration and power being radiated to the foreign object, wasting power and potentially heating the foreign object.

Disclosed herein are wireless power transmitters that consume relatively low power as compared with Qi systems, but that can effectively detect receivers. Accordingly, methods are enabled based on measurements made in an idle state. Performance of the lower power embodiments disclosed herein may be similar to those that use analog/digital ping, as specified by the Qi standard while consuming only a fraction of the power.

In some embodiments, a tank circuit is excited with a very low voltage potential, and several parameters are measured. The measurements may be taken by exciting one coil at a time until all coils have been excited. The voltage potential (e.g., a square wave) used to excite the coils is very low (e.g., 0.25 volts to 1 volt) compared to a ping voltage potential (e.g., 7 volts) of the prior art. The low voltage square wave pulses applied through an inverter excite the tank circuit. A predetermined number of pulses applied to the tank circuit may be between eight and one hundred pulses, without limitation. After application of the predetermined number of pulses, the tank circuit resonates at its natural frequency. A measurement voltage potential (e.g., corresponding to the coil voltage or a coil current representation) is sampled at a very high rate (i.e., higher than the Nyquist frequency such as at 2 megahertz) by an analog to digital converter (ADC) and the samples are stored in an array. The samples are processed to find the peaks of the decaying measurement voltage potential at the tank circuit. The peaks can be used to calculate the Q-factor of the tank circuit and the resonant frequency of the tank circuit. This is done separately for each of the transmitter coils, which may include three coils, without limitation. The calculated Q-factor and resonant frequency of all of the coils are compared, and a decision is made to select the coil that has the best coupling with the receiver. The selected coil is then used to communicate with the receiver and proceed to the power transfer phase (i.e., transmit wireless power to the receiver).

It is noted that either the Q-factor, the resonant frequency, or both may be used to reliably detect the presence of a receiver. Further, metal foreign objects placed in proximity to the transmitter without a wireless power receiver present may be detected without a separate foreign object detection system. If a foreign object is detected the wireless power transmitter may refrain from transmitting power to avoid transmitting power to the foreign object. In contrast, analog/digital ping methods may result in transmission of power to foreign objects if a separate foreign object detection method is not employed. Accordingly, not only do embodiments of the present disclosure enable lower power receiver coil detection as compared to analog/digital ping methods, embodiments disclosed herein enable reliable detection of foreign objects without the use of any additional foreign object detection solution resulting in even more power savings (because a separate foreign object detection system is not being powered) and the use of less chip area (because a separate foreign object detection system is not implemented).

A drastic reduction in the power consumption, as compared to Qi systems, may be achieved if a controller of the wireless power transmitter is put into sleep mode between object detection operations. For example, the controller may be put into sleep mode after performing computations associated with object detection and pulled out of sleep mode after a predetermined delay.

FIG. 1 is a block diagram of a wireless power system 100 including a transmitter 102 and a receiver 104, according to various embodiments of the disclosure. Transmitter 102 is operably coupled to a voltage source 112 (e.g., a direct current (DC) voltage source such as a battery) configured to provide an input voltage Vin, and receiver 104 is coupled to a load 110. Wireless power system 100 further includes a plurality of transmit coils 106 (of which one is shown) and a receive coil 108, which may be used to transfer power 116 from transmitter 102 to receiver 104 (e.g., via inductive coupling). When transmit coils 106 are in proximity with receive coil 108 the transmit coils 106 and the receive coil 108 may be coupled coils 114 (e.g., at least one of the transmit coils 106 may be inductively coupled to the receive coil 108). No physical connection is required between the transmitter 102 and the receiver 104 to transfer power 116 from the transmitter 102 to the receiver 104. Rather, the power 116 is transferred using magnetic flux linkage. The transmitter 102 may control the power 116 transferred by controlling a voltage potential amplitude, frequency, phase, and/or duty cycle provided to the transmit coils 106.

Power transmission may be efficient when one of the transmit coils 106 is properly aligned with receive coil 108. The transmitter 102 is configured to use one of the transmit coils 106 that has a strongest coupling with the receive coil 108 to transmit the power 116 to the receiver 104. The transmitter 102 may detect the presence of the receive coil 108 or some other conductive foreign object. Also, if the receive coil 108 is detected, the transmitter 102 may select one of the transmit coils 106 (e.g., the transmit coil with the strongest coupling to the receive coil 108) to transmit the power 116 to the receive coil 108, as is discussed in more detail below.

Figure 2:
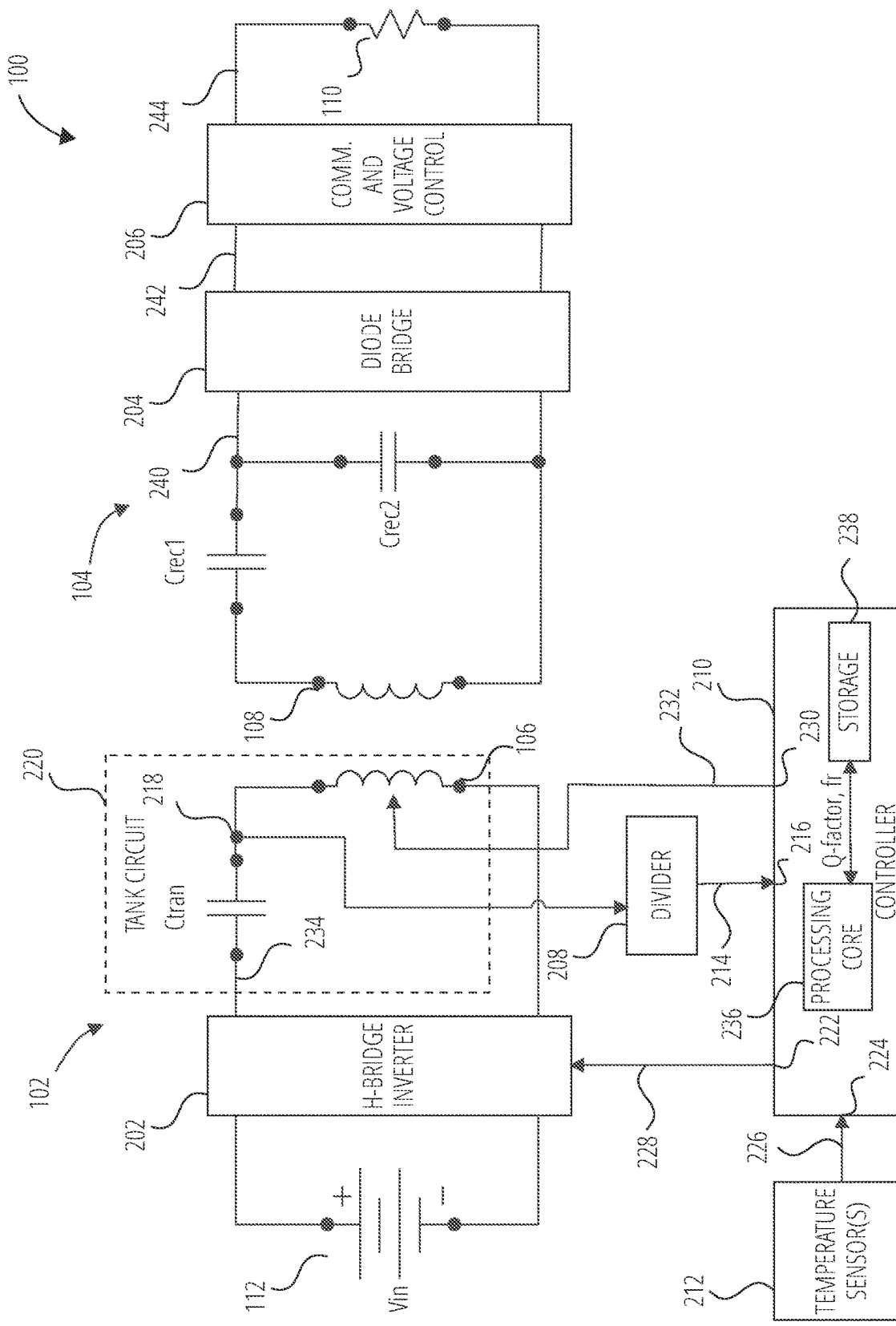
FIG. 2 is a more detailed block diagram of the wireless power system of FIG. 1.

FIG. 2 is a more detailed block diagram of the wireless power system 100 of FIG. 1. FIG. 2 illustrates the transmitter 102, the receiver 104, one of the transmit coils 106, the receive coil 108, the voltage source 112, and the load 110 illustrated in FIG. 1. As illustrated in FIG. 2, the transmitter 102 includes an H-bridge inverter 202, a tank circuit 220 (including the transmit coils 106 and a transmit capacitor Ctran electrically connected in series between the transmit coils 106 and the H-bridge inverter 202), one or more temperature sensor(s) 212, and a controller 210. The H-bridge inverter 202 is electrically connected between the voltage source 112 and the tank circuit 220.

The controller 210 includes a processing core 236 electrically connected to one or more data storage devices (storage 238). The controller 210 also includes a measurement voltage potential input 216 configured to receive a measurement voltage potential 214 responsive to a tank circuit signal 218 (e.g., a tank circuit voltage potential or a tank circuit current) at tank circuit 220 (e.g., taken between the transmit capacitor Ctran and the transmit coils 106, without limitation). By way of non-limiting example, the transmitter 102 may include a divider 208 configured to receive the tank circuit signal 218 and provide the measurement voltage potential 214. By way of non-limiting example, in instances where the tank circuit signal 218 includes a tank circuit voltage potential the divider 208 may include a voltage divider circuit and a unity gain operational amplifier buffer (not shown). In such embodiments, the voltage divider circuit may include a pair of series connected resistors electrically connected between the node the tank circuit signal 218 is taken from and a reference voltage node such as a power supply node (e.g., Vss or ground). The unity gain operational amplifier buffer includes an input electrically connected to a node between the series connected resistors and an output electrically connected to the measurement voltage potential input 216. Alternatively, in embodiments where the tank circuit signal 218 is a tank circuit current the divider 208 may include a current transformer (CT) for coil current measurement. In such embodiments, the CT may be configured to convert the tank circuit signal 218 from a current to the measurement voltage potential 214. Accordingly, the measurement voltage potential may be representative of a coil voltage potential or a coil current of the transmit coils 106, according to various embodiments.

The controller 210 further includes a coil select output 230 configured to provide one or more coil select signals 232 to the transmit coils 106. The coil select signals 232 are configured to selectively control which of the transmit coils 106 conducts an alternating current (AC) signal (AC signal 234) provided to the tank circuit 220. The controller 210 also includes an AC control output 222 configured to provide one or more AC control signals 228 to the H-bridge inverter 202. The AC control signals 228 are configured to control the AC signal 234 applied to the tank circuit 220. For example, with the H-bridge inverter 202 electrically connected between the voltage source 112 and the tank circuit 220, the controller 210 may selectively apply the AC control signals 228 to convert the input voltage potential Vin (e.g., a DC voltage potential) provided by the voltage source 112 to a square wave AC signal 234 (e.g., by periodically inverting the input voltage Vin).

Operations performed by the processing core 236, which is a component of the controller 210, may be interchangeably described as being performed by the controller 210 herein. The processing core 236 of the controller 210 is configured to control the coil select signals 232 to provide the AC signal 234 to each of the transmit coils 106 one at a time. For example, the processing core 236 may control the H-bridge inverter 202 to apply the AC signal 234 to the tank circuit 220 with each of the transmit coils 106 connected one at a time for a predetermined period of time (e.g., for a predetermined number of pulses of a square wave such as eight to one hundred pulses). Following the application of the AC signal to each of the transmit coils 106, the processing core 236 may sample (e.g., at a very high sample rate such as 10 megahertz) the measurement voltage potential 214. Based on the sampled measurement voltage potential 214 for each of the transmit coils 106, the processing core 236 is configured to determine at least one of a resonant frequency fr and a Q-factor of the tank circuit 220 responsive to each selected transmit coil of the transmit coils 106. The Q-factor of the tank circuit 220 is an indicator of how underdamped the tank circuit 220 is, and may be determined by computing the ratio between the resonant frequency and the resonance width (i.e., the full width at half maximum, or FWHM) of the measurement voltage potential 214. By way of non-limiting example, the controller 210 may be configured to detect peaks of the measurement voltage potential 214, which may be used to determine the resonant frequency and the Q-factor of the tank circuit 220. The processing core 236 is configured to store the Q-factor and the resonant frequency fr for each of the transmit coils 106 to the storage 238. The processing core 236 may use the Q-factor and the resonant frequency fr values stored in the storage 238 to determine whether a receive coil 108 is located proximate to the transmit coils 106, whether a conductive foreign object is located proximate to the transmit coils 106, or whether no receive coil 108 and no conductive foreign object is located proximate to the transmit coils 106.

In operation, the processing core 236 may periodically perform an object detection operation. If no receive coil 108 is detected (i.e., a conductive foreign object or no object is detected) the processing core 236 may transition the controller 210 to a low power mode such as a sleep mode or a standby mode. If, however, the processing core 236 detects a receive coil 108 the processing core 236 may select one of the transmit coils 106 to transmit power 116 (FIG. 1) to the receive coil 108. The selection of which of the transmit coils 106 to use may be made based on at least one of the Q-factors and the resonant frequencies fr stored in storage 238.

Inductance of the transmit coils 106 may be affected by temperature. Accordingly, the controller 210 includes a temperature input 224 configured to receive a temperature signal 226 from the temperature sensor(s) 212. The temperature signal 226 is correlated to temperature of the transmitter 102 (e.g., of the transmit coils 106). Since the inductance of the transmit coils 106 may be influenced by temperature, the controller 210 may take into consideration these fluctuations during operation of the transmitter 102.

The receiver 104 includes a resonant tank circuit (not shown) formed by the receive coil 108 and the receive capacitors Crec1 and Crec2 shown in FIG. 2. Accordingly, the receiver 104 may include receiver capacitors Crec1 and Crec2, a diode bridge 204, and communication and voltage control circuitry 206. The receiver capacitor Crec1 may be electrically connected in series between one end of the receive coil 108 and the diode bridge 204, and may have a larger capacitance value than that of Crec2. The receiver capacitor Crec2 may be electrically coupled in parallel across the diode bridge 204. The diode bridge 204 may be configured to rectify an AC received signal 240 received from the receive coil 108 whose energy is provided by the transmitter 102 to provide a DC power signal 242. Accordingly, the output of the resonant tank circuit is passed through the diode bridge 204, which rectifies the AC received signal 240. The communication and voltage control circuitry 206 may be configured to receive the DC power signal 242 and produce a load voltage potential 244 to the load 110. By way of non-limiting example, the communication and voltage control circuitry 206 may include a buck converter or low-dropout regulator (LDO), which provides a fixed load voltage potential 244 at the load 110. The communication and voltage control circuitry 206 may be implemented in a controller (e.g., microcontroller), without limitation.

Figure 3:
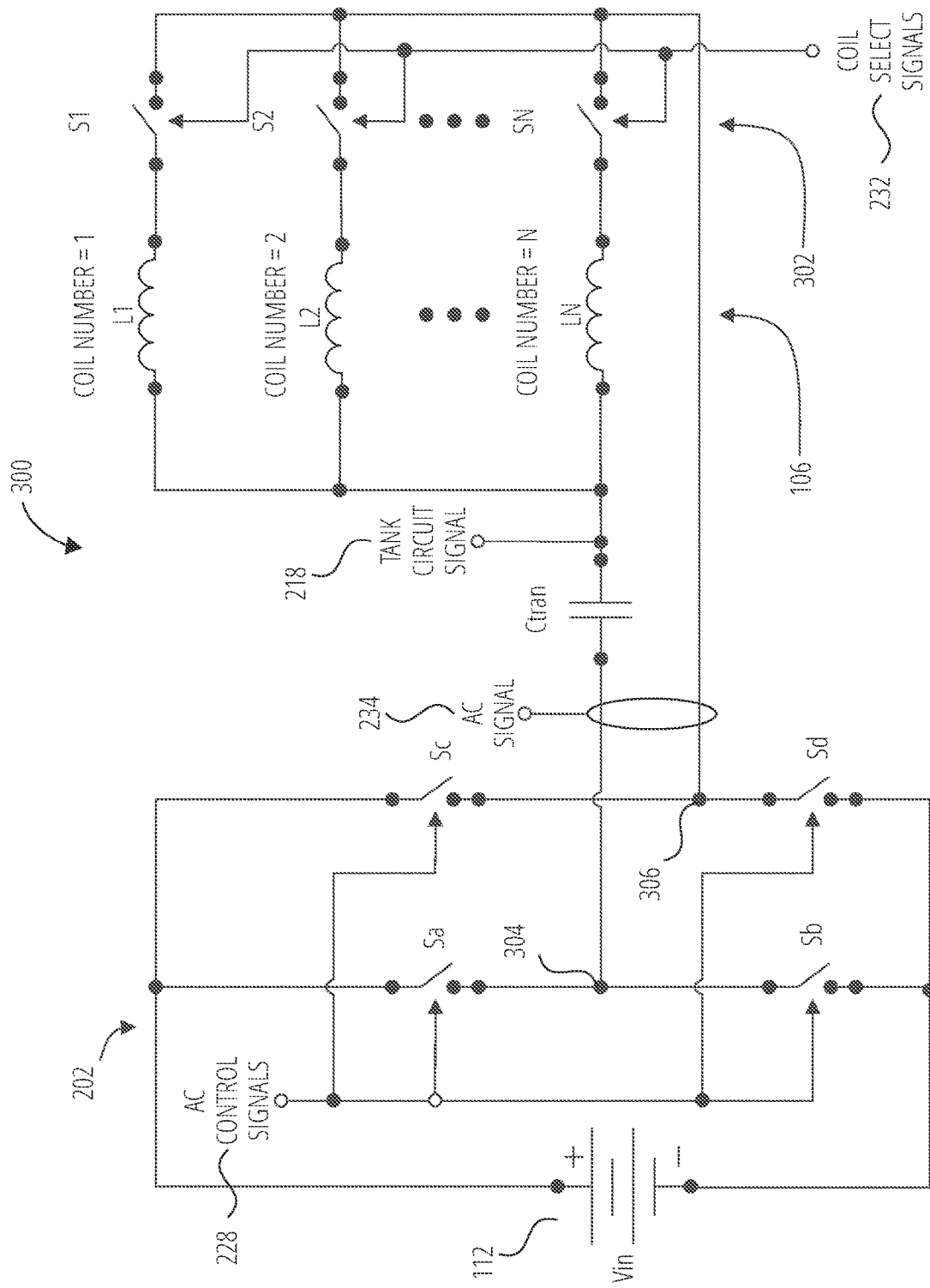
FIG. 3 is a schematic illustration of a segment of a wireless power transmitter of FIG. 1 and FIG. 2.

FIG. 3 is a schematic illustration of a segment 300 of the wireless power transmitter 102 of FIG. 1 and FIG. 2. Referring to FIG. 2 and FIG. 3 together, the segment 300 includes the voltage source 112, the H-bridge inverter 202, the transmit capacitor Ctran, and the transmit coils 106 (L1, L2, ..., LN) discussed above. An input of the H-bridge inverter 202 is illustrated in FIG. 3 as being electrically connected to the voltage source 112. It should be noted, however, that in some embodiments, the input of the H-bridge inverter 202 may instead be electrically connected to an output of a converter (not shown) (e.g., a DC to DC converter such as a four-switch buck boost converter (FSBBC), without limitation). The segment 300 also illustrates coil switches 302 (coil switches S1, S2, ..., SN) each electrically connected serially with a respective transmit coil 106. The number N of the transmit coils 106 and the coil switches 302 may be any number (e.g., two, three, four, five, ten, twenty, without limitation). The coil switches 302 are electrically controllable to enable the controller 210 to selectively open and close the coil switches 302 via the coil select signals 232. By closing one of the coil switches 302 associated with one of the transmit coils 106, the associated one of the transmit coils 106 is effectively placed in the tank circuit 220 (FIG. 2). In some embodiments, only one of the transmit coils 106 is selected at a time (e.g., by closing the associated one of the coil switches 302). In some embodiments, the coil switches 302 may be transistors (e.g., back-to-back MOSFETs for conducting bidirectional AC current in the tank circuit) having gates electrically connected to the coil select signals 232. Accordingly, the coil select signals 232 provided by the controller 210 may include a bus of signals configured to individually control the coil switches 302.

The H-bridge inverter 202 also includes several electrically controllable switches (switches Sa, Sb, Sc, and Sd). Switches Sa, Sb, Sc, and Sd are electrically controllable via the AC control signals 228 from the controller 210 to generate the AC signal 234 across a first node 304 and a second node 306 of the H-bridge inverter 202. By way of non-limiting example, the switches Sa, Sb, Sc, and Sd may be transistors having the AC control signals 228 electrically connected to their gates. In some embodiments, switches Sa, Sb, Sc, and Sd may be MOSFET transistors driven by MOSFET drivers. The controller 210 may disable, or turn off, the AC signal 234 by de-asserting the AC control signals 228 at each of the switches Sa, Sb, Sc, and Sd (i.e., providing a voltage potential configured to open the switch). With the AC signal 234 disabled the first node 304 and the second node 306 may be in an electrically floating state. The controller 210 may activate the AC signal 234 by alternating between: closing switches Sa and Sd while opening switches Sc and Sb; and opening switches Sa and Sd while closing switches Sc and Sb. Switches Sa, Sb, Sc, and Sd may be closed by asserting the respective AC control signals 228. The AC control signals 228 provided by the controller 210 may include a bus of signals configured to control the switches Sa, Sb, Sc, and Sd. In some embodiments, a single signal of the AC control signals 228 may control switches Sa and Sd and another signal may control switches Sc and Sd. In some embodiments, the AC control signals 228 may include four separate signals to control the switches Sa, Sb, Sc, and Sd separately. In some embodiments, MOSFET driver inputs (not shown) of MOSFET drivers (not shown) electrically coupled between the controller 210 (FIG. 2) and the switches Sa, Sb, Sc, and Sb are controlled by the AC control signals 228, which may be provided by pulse-width modulation (PWM) outputs from PWM output pins of the controller 210, without limitation. With switches Sa and Sd closed and switches Sb and Sc open the voltage potential across first node 304 and second node 306 may be Vin, resulting in a positive half cycle of the AC signal 234. With switches Sa and Sd open and switches Sb and Sc closed the voltage potential across first node 304 and second node 306 may be −Vin, resulting in a negative half cycle of the AC signal 234. Accordingly, with alternation between these two states a square wave AC signal 234 across first node 304 and second node 306 results. By way of non-limiting example, a frequency of operation (i.e., a switching frequency, which in turn amounts to a frequency of the AC signal 234) may be set to substantially 125 kHz. As a result, the H-bridge inverter 202 applies the AC signal 234 across the tank circuit 220 (FIG. 2) formed by a capacitance of the transmit capacitor and an inductance of the transmit coils 106.

The controller 210 is configured to periodically control the wireless power transmitter 102 to perform an object detection operation. In time periods between object detection operations the wireless power transmitter 102 may operate in a low power state (e.g., a sleep mode or a standby mode) to conserve power. The object detection operation includes a data collection operation (e.g., the data collection method 700 of FIG. 7), a data processing operation (e.g., the data processing method 800 of FIG. 8), and an object sensing operation (e.g., the object sensing method 900 of FIG. 9).

In the data collection operation, the controller 210 is configured to set a coil number equal to a first number. Each transmit coil of the transmit coils 106 is associated with a particular number from the first number to a last number, as illustrated in FIG. 3. For example, transmit coil L1 is associated with coil number=1, transmit coil L2 is associated with coil number=2, and transmit coil LN is associated with coil number=N. Similarly, each coil switch of the coil switches 302 is associated with a number from the first number to the last number. For example, coil switch S1 is associated with coil number=1, coil switch S2 is associated with coil number=2, and coil switch SN is associated with coil number=N.

In the data collection operation, the controller 210 may also close one of the coil switches 302 associated with the coil number to electrically connect the one of the transmit coils 106 associated with the coil number to the H-bridge inverter. The controller 210 may control the H-bridge inverter 202 to provide the AC signal 234 to the tank circuit 220. After application of the AC signal 234 to the tank circuit 220, which may charge the tank circuit 220, the controller 210 may sample the measurement voltage potential 214 responsive to the tank circuit signal 218. The controller 210 may then increment the coil number and repeat the data collection operation for each one of the coils (i.e., unless the incremented coil number is greater than the last number, which in the case of FIG. 3 is coil number=N).

In the data processing operation the controller 210 may set the coil number equal to the first number (coil number=1 in case of FIG. 3), identify peaks in the sampled measurement voltage potential 214 associated with the coil number, calculate a quality factor (Q-factor) of the tank circuit 220 associated with the coil number based, at least in part, on the identified peaks, and determine a resonant frequency fr of the tank circuit 220 associated with the coil number based, at least in part, on the identified peaks. In some embodiments, peaks in the measurement voltage potential 214 may be identified by identifying samples of the measurement voltage potential that are greater than both a sample that is immediately before and a sample that is immediately following the identified sample. The controller 210 may then increment the coil number and store the calculated Q-factor and the determined resonant frequency fr to storage 238. The controller 210 may then repeat the data processing operation for each of the transmit coils 106 (i.e., unless the incremented coil number is greater than the last number, which in the case of FIG. 3 is coil number=N).

In the object sensing operation the controller is configured to determine whether a receive coil of a wireless power receiver, a foreign object, or nothing is located proximate to at least one of the plurality of transmit coils 106 based at least in part on the stored Q-factor and the stored resonant frequency associated with each of the plurality of transmit coils 106. For example, the controller 210 may determine a lowest Q-factor of Q-factors stored in the storage 238, identify a lowest Q-factor transmit coil (i.e., the one of the transmit coils 106 that is associated with the lowest Q-factor), determine a lowest resonant frequency fr of resonant frequencies stored in the storage 238, and identify a lowest resonant frequency transmit coil (i.e., the one of the transmit coils 106 that is associated with the lowest resonant frequency fr). The controller 210 may then determine whether the lowest Q-factor is less than a threshold minimum Q-factor value (e.g., about 40 to 45).

If it is determined that the lowest Q-factor is less than the threshold minimum Q-factor value, the controller 210 may determine whether the lowest resonant frequency is greater than an expected uncoupled resonant frequency of the tank circuit 220 (e.g., about 78 kilo Hertz assuming that the value of the transmit capacitor Ctran is about 400 nano-farads and the value of each of the transmit coils 106 is about 10 micro-henrys). The controller 210 may also select the lowest Q-factor transmit coil 106 to transmit power to a receive coil 108 of a wireless power receiver 104 if it is determined that the lowest resonant frequency fr is not greater than the expected uncoupled resonant frequency fr of the tank circuit 220. If the lowest Q-factor transmit coil is selected, the controller 210 may control the transmitter 102 to use the selected lowest Q-factor transmit coil to transmit power 116 to the receive coil 108 (e.g., by controlling the coil select signals 232 to close the one of the coil switches 302 that is associated with the selected lowest Q-factor transmit coil and enabling the AC signal 234 using the AC control signals 228 to transmit power 116). If, however, it is determined that the lowest resonant frequency is greater than the expected uncoupled resonant frequency of the tank circuit 220, the controller 210 may determine that a foreign object is located proximate to the transmit coils 106, and enter a sleep mode until the next object detection operation.

If, however, it is determined that the lowest Q-factor is not less than the threshold minimum Q-factor value, the controller 210 may determine whether the lowest resonant frequency fr is less than a threshold minimum resonant frequency (e.g., about 75 kilo Hertz). The controller 210 may select the lowest resonant frequency transmit coil (i.e., the one of the transmit coils 106 that is associated with the lowest resonant frequency) to transmit power to the receive coil if it is determined that the lowest resonant frequency is less than the threshold minimum resonant frequency, and transmit the wireless power 116 to the receive coil 108 using the selected lowest resonant frequency transmit coil. If, however, it is determined that the lowest resonant frequency is not less than the threshold minimum resonant frequency the controller 210 may control the transmitter 102 to operate in a sleep mode until the next object detection operation.

The controller 210 may also be configured to perform calibrations of the transmitter 102. As previously mentioned, the inductance of the transmit coils 106 may fluctuate responsive to temperature fluctuations. As a result, the controller 210 may take into consideration these fluctuations due to temperature fluctuations during the object detection operation. For example, the controller 210 may be configured to adjust the value of the threshold minimum Q-factor value, the expected uncoupled resonant frequency value, and the threshold minimum resonant frequency value used during the object sensing operation based on the temperature signal 226. Also, in some embodiments, the transmit coils 106 may experience different temperatures from each other. As a result, the controller 210 may be configured to adjust measured Q-factors and resonant frequencies for the coils based on the temperature differences to prevent temperature differences between the transmit coils 106 from influencing object detection and transmit coil selection.

Furthermore, inductance values of the transmit coils 106 may not all be the same. By way of non-limiting example, the inductance values of the transmit coils 106 may vary by about twenty percent (20%) due to manufacturing tolerances. Accordingly, the controller 210 may be configured to perform a calibration to normalize differences between the inductance values of the transmit coils 106 to prevent differences between inductance values of the transmit coils 106 from influencing object detection and transmit coil selection. By way of non-limiting example, determined Q-factor values and/or determined resonant frequency values may be adjusted based on known (e.g., previously measured) inductance values of the transmit coils 106. As a specific, non-limiting example, each resonant frequency fr may be multiplied by a ratio between the known inductance value of the corresponding one of the transmit coils 106 and an average of the inductance values of all the transmit coils 106. As a result, a lowest resonant frequency transmit coil associated with a lowest resonant frequency fr has the lowest resonant frequency fr because it is coupling better with the receive coil 108 than the others of the transmit coils 106, not because it has the lowest inductance value.

Figure 4:
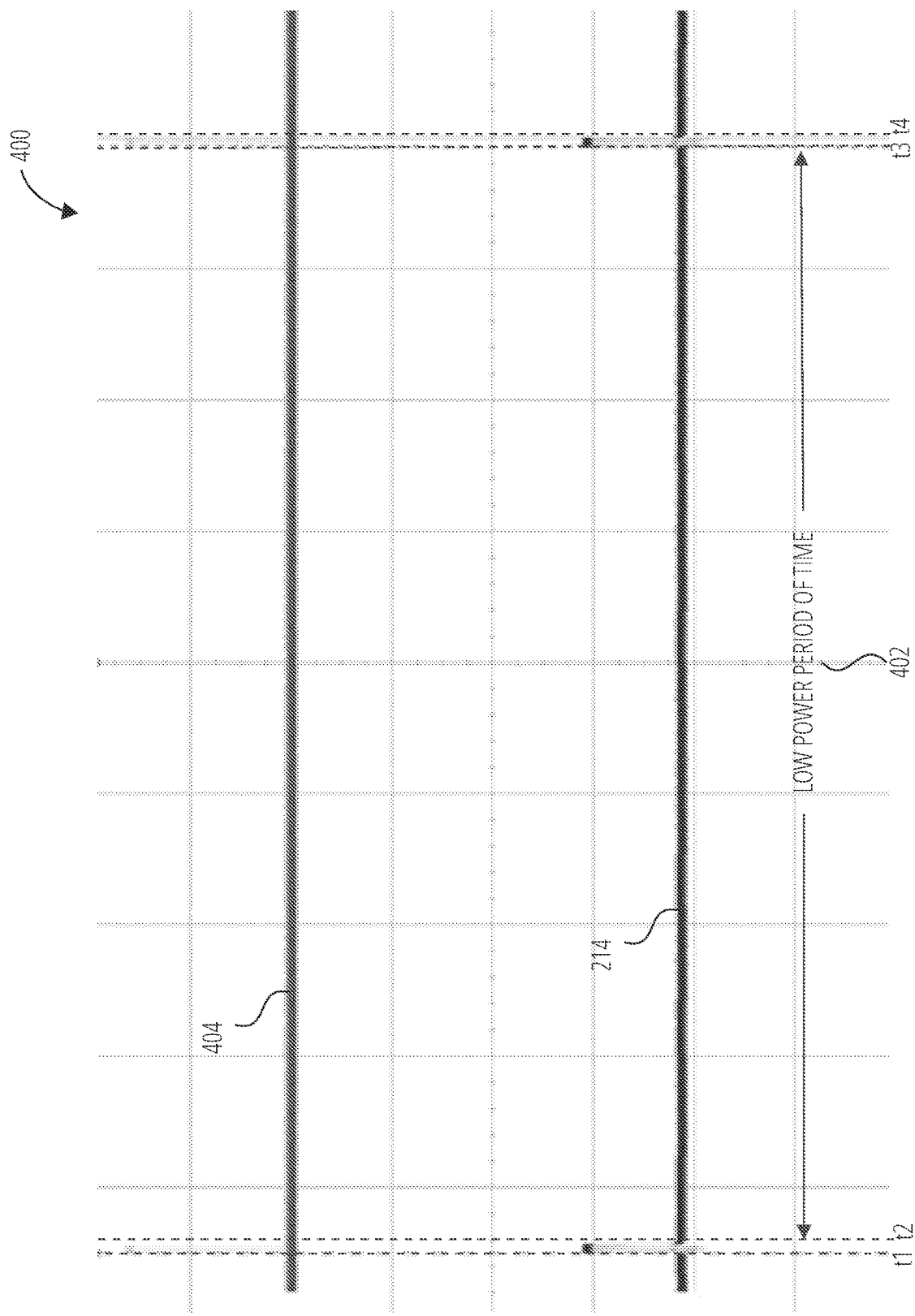
FIG. 4 is a plot illustrating example voltage potentials of the segment of the wireless power transmitter illustrated in FIG. 3.
Figure 5:
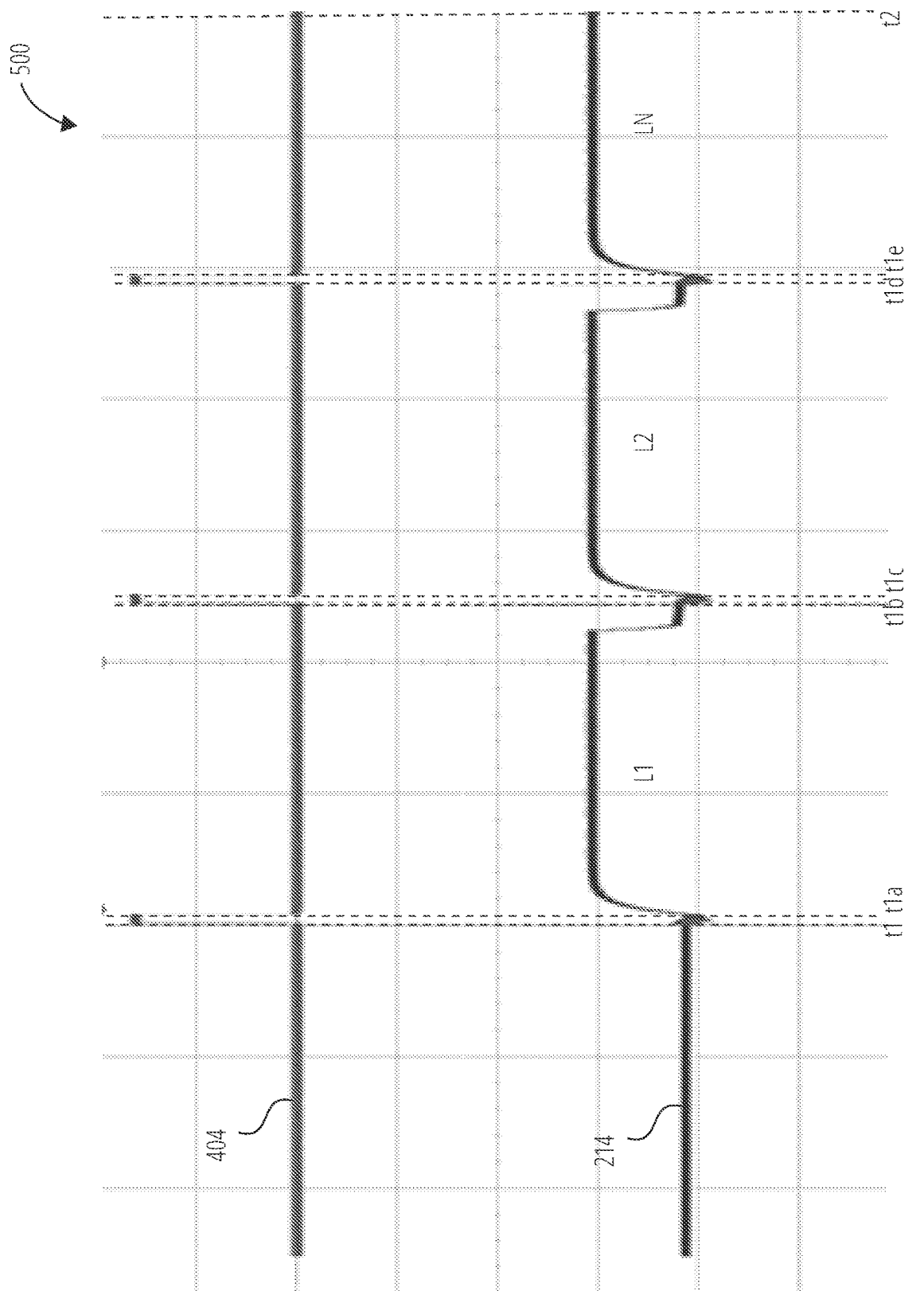
FIG. 5 is a plot illustrating example voltage potentials of the segment of the transmitter illustrated in FIG. 3 during an object detection operation.
Figure 6:
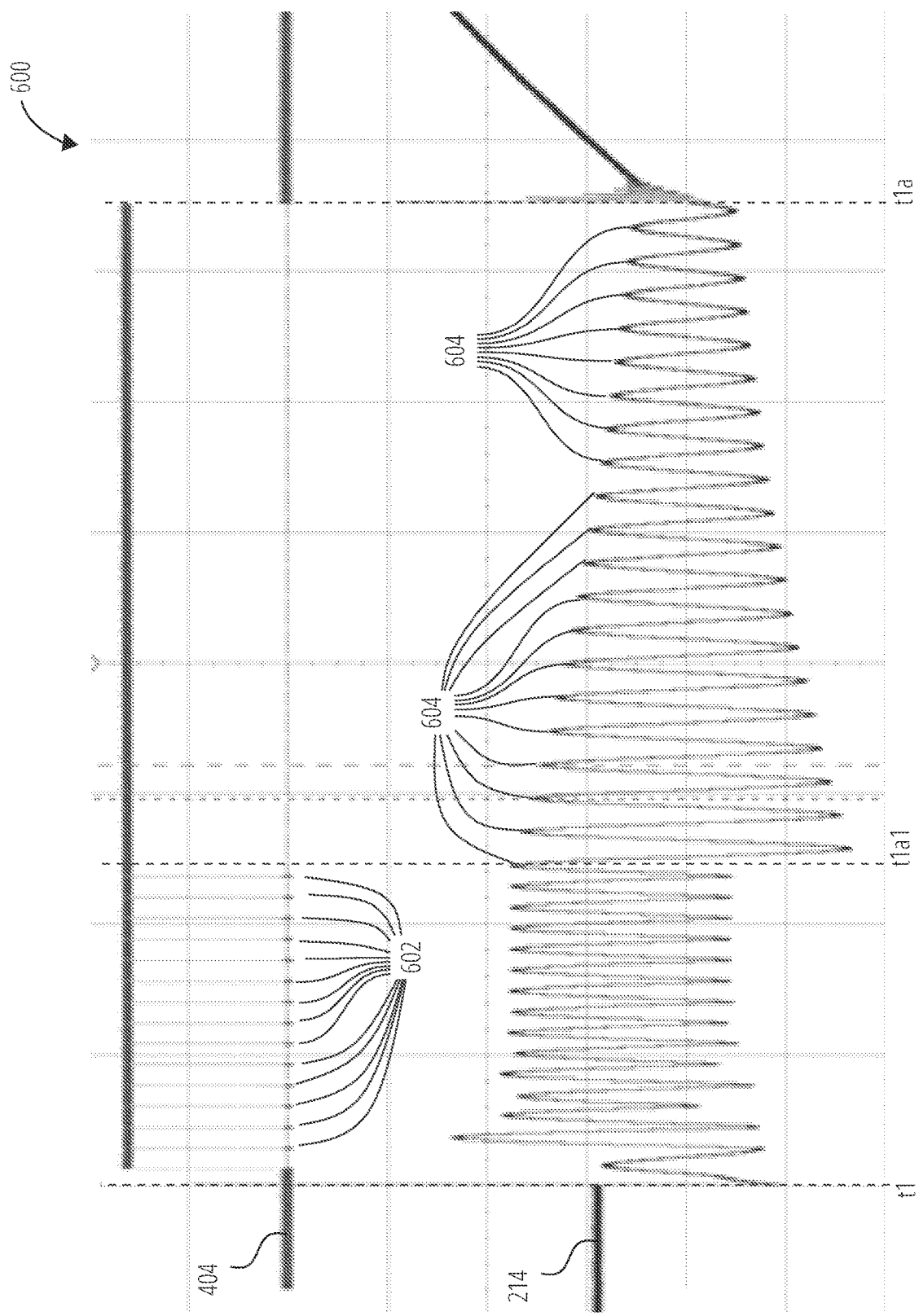
FIG. 6 is a plot illustrating example voltage potentials of the segment of the transmitter illustrated in FIG. 3 during a data collection operation of the object detection operation.

FIG. 4 is a plot 400 illustrating example voltage potentials of the segment 300 of the wireless power transmitter 102 (FIG. 1 and FIG. 2) illustrated in FIG. 3. The plot 400 includes the measurement voltage potential 214 and an AC control signal 404 of the AC control signals 228 of FIG. 1 and FIG. 2 plotted against time (with the passage of time from earlier to later illustrated from left to right in FIG. 4). The AC control signal 404 is one of the AC control signals 228 of FIG. 2 and FIG. 3 applied to one of the switches Sa, Sb, Sc, or Sd of FIG. 3. As a result, the AC control signal 404 is configured to control one of the switches Sa, Sb, Sc, or Sd to selectively operably couple the first node 304 or the second node 306 to the positive and negative terminals of the DC voltage source 112. The majority of the plot 400 of FIG. 4 covers a low power period of time 402. At times t1 and t3, however, the controller 210 (FIG. 2) may initiate an object detection operation. Assuming that a conductive foreign object or no object is detected the object detecting operation may terminate at times t2 and t4, respectively, and operate in a low power mode (e.g., a sleep mode, a standby mode) between times t2 and t3. Accordingly, during a low power period of time 402 between t2 and t3 the transmitter 102 may operate in a low power mode, conserving power between object detecting operations. Since the majority of the plot 400 covers low power operation time (e.g., low power period of time 402), the only activity observable for the AC control signal 404 and the measurement voltage potential 214 is between times t1 and t2, and between times t3 and t4. Accordingly, for the most part, the AC control signal 404 and the measurement voltage potential 214 appear as straight, unchanging lines in the plot 400 of FIG. 4. FIG. 5 and FIG. 6 illustrate activity of the AC control signal 404 and the measurement voltage potential 214 between times t1 and t2 in more detail.

FIG. 5 is a plot 500 illustrating example voltage potentials of the segment 300 of the transmitter 102 (FIG. 1 and FIG. 2) illustrated in FIG. 3 during an object detection operation. The plot 500 includes plots of the AC control signal 404 and the measurement voltage potential 214. By way of non-limiting example, the plot 500 may illustrate the behavior of the AC control signal 404 and the measurement voltage potential 214 between time t1 and time t2, or between time t3 and time t4, of the plot 400 of FIG. 4. FIG. 5 specifically indicates times t1 and t2, but it will be appreciated that from time t3 to time t4 of the plot 400 of FIG. 4, AC control signal 404 and measurement voltage potential 214 may be similar (e.g., depending on temperature and other operating parameters) to the AC control signal 404 and measurement voltage potential 214 illustrated between times t1 and t2 of the plot 500.

At time t1, the controller 210 selects transmit coil L1 (FIG. 5 indicates L1 between t1 and t1b to show that transmit coil L1 is connected) and activates the AC signal 234 by alternating the AC control signal 404 with others of the AC control signals 228 (FIG. 2 and FIG. 3; the AC control signal 404 is complementary to at least one other of the AC control signals 228) to generate a square wave (i.e., the AC signal 234 of FIG. 3). In response, the tank circuit 220 charges up and the measurement voltage potential 214 begins to oscillate (the oscillations and alternation of the AC control signal 404 are better seen between time t1 and time t1a1 of FIG. 6). After a predetermined number of pulses of the AC control signal 404 the controller 210 stops alternating the AC control signal 404, and the measurement voltage potential 214 starts to oscillate in a decaying manner according to a natural resonance frequency of the tank circuit 220 (these decaying oscillations are better seen between time t1a1 and time t1a of FIG. 6). The measurement voltage potential 214 is sampled, and the samples may be used to determine the Q-factor and the resonant frequency of the tank circuit 220 having L1 connected. At time t1a, i.e., after a predetermined delay from time t1, the controller 210 may de-assert the AC control signal 404. FIG. 6 below illustrates the time period of the plot 500 between t1 and t1a in more detail. It is noted that at time t1a, one of switches Sa and Sc (FIG. 3) is closed while the other switches are open, and the positive input voltage+Vin is applied to one of the first node 304 and the second node 306 (FIG. 3), driving the measurement voltage potential 214 to start ramping up toward high. The measurement voltage potential 214 shown in FIG. 5 then remains high (although negligent current flows through transmit coil L1 so negligent power is expended or transmitted) until the one of switches Sa and Sc that is closed is opened a period of time before time t1b, electrically isolating the first node 304 and the second node 306 from the input voltage+Vin. As a result of the one of switches Sa and Sc being opened a period of time before time t1b, the measurement voltage potential 214 drops before time t1b. Alternatively, at time t1a, one of the first node 304 or the second node 306 may be set to ground (e.g., zero volts), in which case the measurement voltage potential 214 will not rise and fall between time t1a and time t1b (not shown).

At time t1b, the controller 210 selects transmit coil L2 and repeats the operations discussed above for transmit coil L1 (between times t1 and t1a) for transmit coil L2 between times t1b and t1c. At time t1d, the controller 210 selects transmit coil LN and repeats the operations discussed above for transmit coil LN (between times t1b and t1c) for transmit coil LN between times t1d and t1e. At time t2, the controller 210, now having performed the operations for each of the transmit coils 106 (FIG. 1, FIG. 2, and FIG. 3), may have Q-factor and resonant frequency values for each of the transmit coils 106 and thus may perform a data processing operation and an object sensing operation.

FIG. 6 is a plot 600 illustrating example voltage potentials of the segment 300 of the transmitter 102 (FIG. 1 and FIG. 2) illustrated in FIG. 3 during a data collection operation of the object detection operation. The plot 600 includes plots of the AC control signal 404 and the measurement voltage potential 214. By way of non-limiting example, the plot 600 may illustrate the behavior of the AC control signal 404 and the measurement voltage potential 214 between time t1 and time t1a, between time t1b and time t1c, or between time t1d and time t1e of the plot 500 of FIG. 5. FIG. 6 specifically indicates times t1 and t1a, but it will be appreciated that from time t1b to time t1c and from time t1d to time t1e AC control signal 404 and measurement voltage potential 214 may be similar (e.g., depending on temperature and other operating parameters) to the AC control signal 404 and measurement voltage potential 214 illustrated between times t1 and t1a of the plot 600.

As previously discussed, at time t1, the controller 210 (FIG. 2) selects transmit coil L1 (FIG. 3) and enables the AC signal 234 (FIG. 2, FIG. 3) by alternating the AC control signal 404 with others of the AC control signals 228 (FIG. 2 and FIG. 3) to generate a square wave. FIG. 6 shows pulses 602, which correspond to pulses of the AC signal 234. It will be noted that the pulses 602 have a relatively small pulse width, which may cause the duty cycle of the corresponding AC signal 234 to be relatively low (e.g., substantially 10% assuming that the 0.7 volts of the AC signal 234 is applied to the transmit coil, without limitation), which may in turn result in a correspondingly low amount of power expenditure even while the AC signal 234 is enabled. In response to the pulses of the AC signal 234, the tank circuit 220 charges up and the measurement voltage potential 214 begins to oscillate. It should be noted that the tank circuit 220 may require a relatively low average voltage potential of the AC signal 234 to charge the tank circuit 220 as compared to that of analog/digital ping methods. This average voltage potential may be achieved by using a very low voltage magnitude of the input voltage potential Vin of the voltage source 112 (FIG. 1, FIG. 2, and FIG. 3) with a relatively higher duty cycle of the pulses 602, a relatively higher magnitude of the input voltage potential Vin and a relatively lower duty cycle of the pulses 602, or moderate input voltage potential Vin and moderate duty cycle of the pulses 602.

After a predetermined number of pulses 602 (e.g., about 15 pulses in FIG. 6) of the AC control signal 404, at time t1a1, the controller 210 stops oscillating the AC control signal 404, and the measurement voltage potential 214 starts to oscillate in a decaying manner according to a natural resonance frequency of the tank circuit 220. During this oscillation the tank circuit may be connected, throughout the oscillation (e.g., from time t1a1 to time t1a) to a negative or positive terminal of the DC power supply (e.g., DC voltage source 112 of FIG. 1, FIG. 2, and FIG. 3) through the H-bridge inverter (e.g., switches Sb and Sd of the H-bridge inverter 202 of FIG. 2 and FIG. 3 may be closed to connect the tank circuit 220 to the negative terminal, and switches Sa and Sc of FIG. 2 and FIG. 3 may be closed to connect the tank circuit 220 to the positive terminal) to enable the tank circuit 220 to discharge. During this discharge of the tank circuit 220, the measurement voltage potential 214 oscillates in a decaying manner. The measurement voltage potential 214 is sampled, and the samples may be used to determine the Q-factor and the resonant frequency fr of the tank circuit 220 having L1 connected. The Q-factor and the resonant frequency fr may be determined by identifying peaks 604 of the measurement voltage potential 214. By way of non-limiting example, twenty of the peaks 604 may be identified. In some embodiments, the Q-factor and the resonant frequency fr may be determined as an instantaneous Q-factor and an instantaneous resonant frequency between any two adjacent peaks of the peaks 604 (e.g., a first two of the peaks 604 after time t1a1). In some embodiments, the Q-factor and the resonance frequency may be determined as an average Q-factor and an average resonant frequency taken as an average over three or more (e.g., all) of the peaks 604. At time t1a, i.e., after a predetermined delay (to allow the tank circuit 220 to substantially discharge), the controller 210 may de-assert the AC control signal 404.

Figure 7:
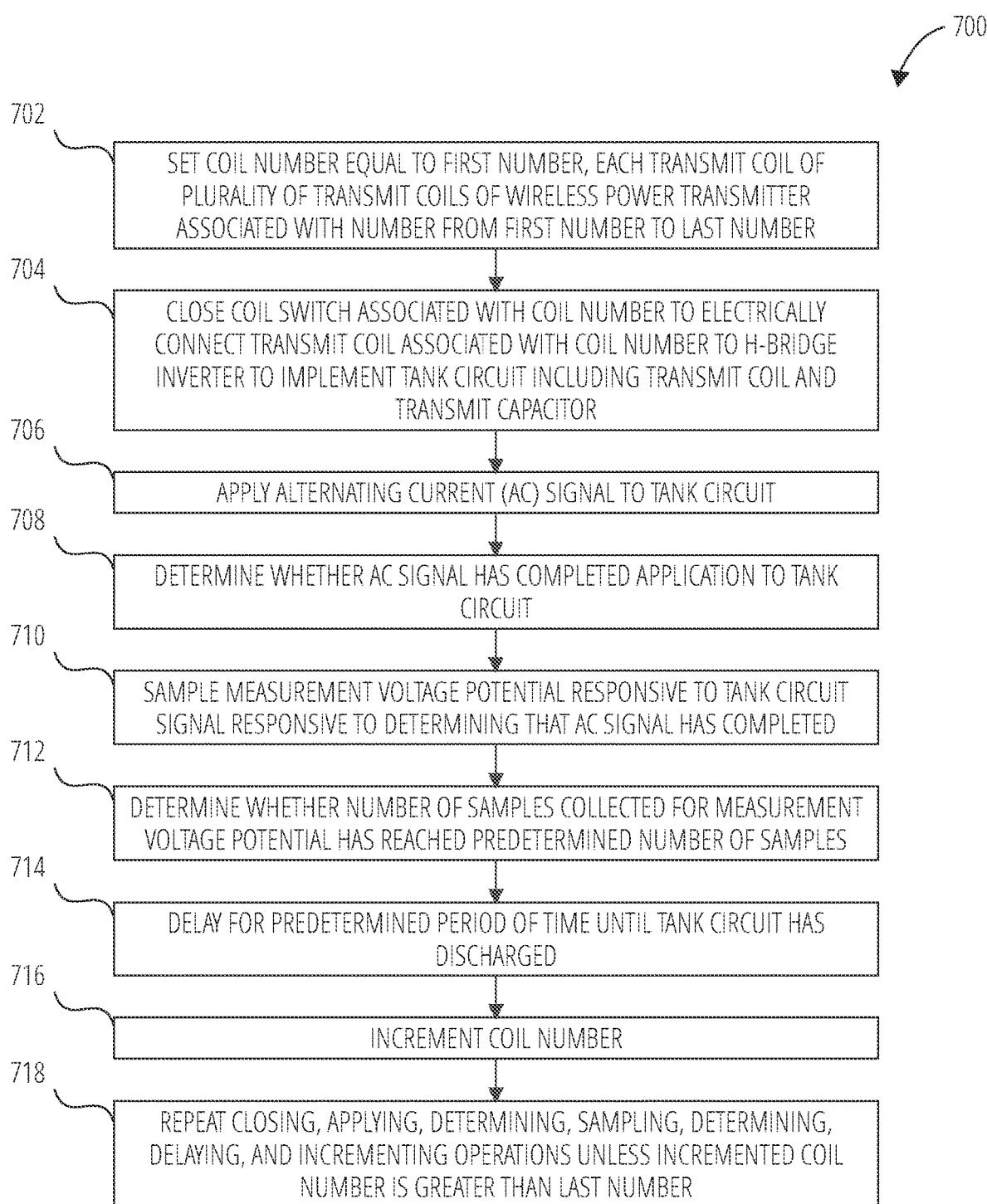
FIG. 7 is a flowchart illustrating a data collection method for an object detection operation of a wireless power transmitter, according to some embodiments.

FIG. 7 is a flowchart illustrating a data collection method 700 for an object detection operation of a wireless power transmitter (e.g., the transmitter 102 of FIG. 1 and FIG. 2), according to some embodiments. In operation 702, data collection method 700 sets a coil number equal to a first number. Each transmit coil of a plurality of transmit coils of the wireless power transmitter is associated with a number from the first number to a last number. In operation 704, data collection method 700 closes a coil switch associated with the coil number to electrically connect a transmit coil associated with the coil number to an H-bridge inverter to implement a tank circuit including the transmit coil and a transmit capacitor. In operation 706, data collection method 700 applies an AC signal to the tank circuit responsive to operation of the H-bridge inverter. In some embodiments, applying an AC signal to the tank circuit includes enabling one or more AC control signals configured to control the AC signal. In some embodiments, enabling one or more AC control signals includes enabling one or more pulse-width modulation signals (e.g., the AC control signals 228) configured to control the H-bridge inverter operably coupled to a DC voltage source (e.g., voltage source 112) to generate the AC signal.

In operation 708, data collection method 700 determines whether the AC signal has completed application to the tank circuit. By way of non-limiting example, it may be determined that the AC signal has completed operation responsive to a detection that a predetermined period of time has passed since initialization of the AC signal. Also by way of non-limiting example, it may be determined that a predetermined number of pulses of the AC signal have been applied to the tank circuit.

In operation 710, data collection method 700 samples a measurement voltage potential responsive to a tank circuit signal at the tank circuit responsive to determining that the AC signal has completed. In operation 712, data collection method 700 determines whether a number of samples collected for the measurement voltage potential has reached a predetermined number of samples. In operation 714, data collection method 700 delays for a predetermined period of time (e.g., corresponding to a predetermined number of peaks of the measurement voltage potential) until the tank circuit has discharged. In operation 716, data collection method 700 increments the coil number. In operation 718, data collection method 700 repeats the closing (operation 704), applying (operation 706), determining (operation 708), sampling (operation 710), determining (operation 712), delaying (operation 714), and incrementing (operation 716) operations unless the incremented coil number is greater than the last number.

Figure 8:
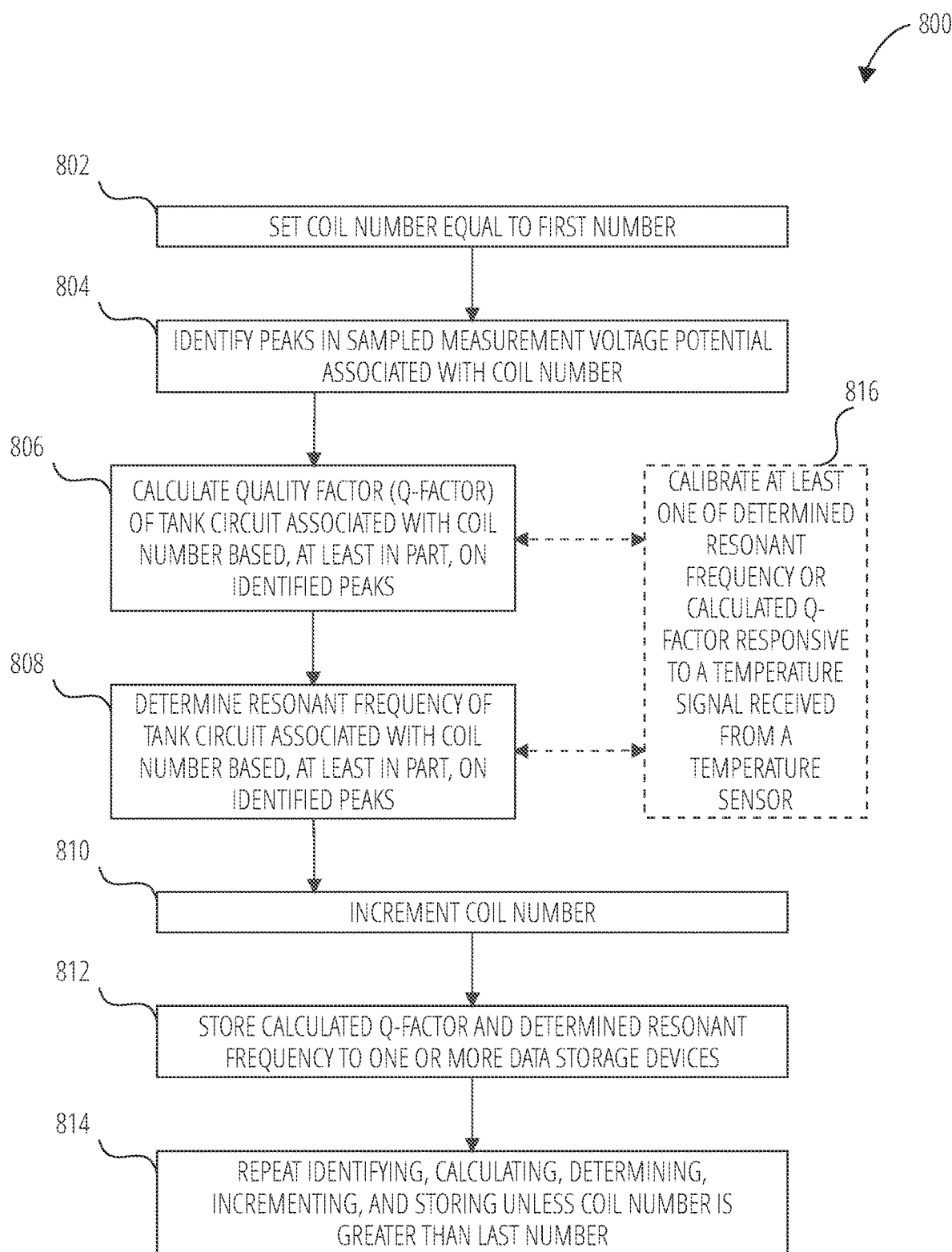
FIG. 8 is a flowchart illustrating a data processing method for an object detection operation of a wireless power transmitter, according to some embodiments.

FIG. 8 is a flowchart illustrating a data processing method 800 for an object detection operation of a wireless power transmitter (e.g., the transmitter 102 of FIG. 1). In operation 802, data processing method 800 sets the coil number equal to the first number. Each transmit coil of a plurality of transmit coils of the wireless power transmitter is associated with a number from the first number to a last number. In operation 804, data processing method 800 identifies peaks in the sampled measurement voltage potential associated with the coil number. In operation 806, data processing method 800 calculates a quality factor (Q-factor) of the tank circuit associated with the coil number based, at least in part, on the identified peaks. In operation 808, data processing method 800 determines a resonant frequency fr of the tank circuit associated with the coil number based, at least in part, on the identified peaks. In some embodiments, at operation 816, data processing method 800 calibrates at least one of the determined resonant frequency or the calculated Q-factor responsive to a temperature signal (e.g., temperature signal 226 of FIG. 2) received from a temperature sensor (e.g., the temperature sensors 212 of FIG. 2). In operation 810, data processing method 800 increments the coil number. In operation 812, data processing method 800 stores the calculated Q-factor and the determined resonant frequency to one or more data storage devices. In operation 814, data processing method 800 repeats the identifying, calculating, determining, incrementing, and storing unless the coil number is greater than the last number.

Figure 9:
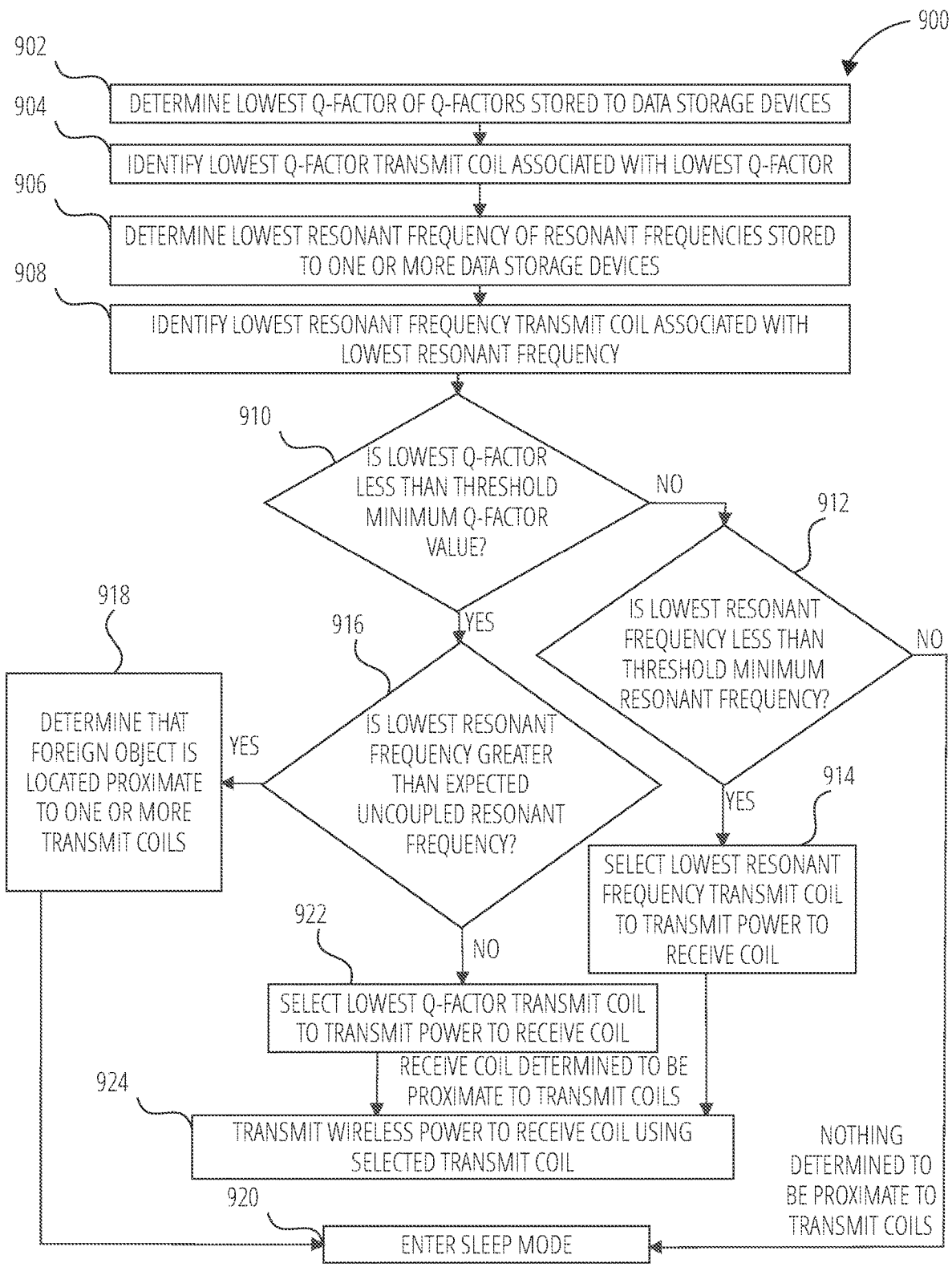
FIG. 9 is a flowchart illustrating an object sensing method for an object detection operation of a wireless power transmitter, according to some embodiments.

FIG. 9 is a flowchart illustrating an object sensing method 900 for an object detection operation of a wireless power transmitter (e.g., the transmitter 102 of FIG. 1). In operation 902, object sensing method 900 determines a lowest Q-factor of Q-factors stored to the one or more data storage devices. In operation 904, object sensing method 900 identifies a lowest Q-factor transmit coil associated with the lowest Q-factor. In operation 906, object sensing method 900 determines a lowest resonant frequency of resonant frequencies stored to the one or more data storage devices. In operation 908, object sensing method 900 identifies a lowest resonant frequency transmit coil associated with the lowest resonant frequency. In decision 910, object sensing method 900 determines whether the lowest Q-factor is less than a threshold minimum Q-factor value.

If, in decision 910, it is determined that the lowest Q-factor is not less than the threshold minimum Q-factor value, the object sensing method 900 proceeds to decision 912. In decision 912, object sensing method 900 determines whether the lowest resonant frequency is less than a threshold minimum resonant frequency. If it is determined that the lowest resonant frequency is less than the threshold minimum resonant frequency the object sensing method 900 proceeds to operation 914. In operation 914, object sensing method 900 selects the lowest resonant frequency transmit coil to transmit power to the receive coil, and in operation 924, object sensing method 900 transmits the wireless power to the receive coil using the selected lowest resonant frequency transmit coil (implying that a receive coil is determined to be proximate to the transmit coils). If, however, it is determined that the lowest resonant frequency is not less than the threshold minimum resonant frequency it is determined that nothing (no conductive object) is determined to be located proximate to the transmit coils, and object sensing method 900 proceeds to operation 920. In operation 920, object sensing method 900 enters a sleep mode.

If, however, it is determined, in decision 910, that the lowest Q-factor is less than the threshold minimum Q-factor value, object sensing method 900 proceeds to decision 916. In decision 916, object sensing method 900 determines whether the lowest resonant frequency is greater than an expected uncoupled resonant frequency of the tank circuit. If it is determined that the lowest resonant frequency is greater than the expected uncoupled resonant frequency, object sensing method 900 proceeds to operation 918. In operation 918, object sensing method 900 determines that a foreign object is located proximate to the one or more transmit coils, and object sensing method 900 proceeds to operation 920. In operation 920, object sensing method 900 enters a sleep mode.

Returning to decision 916, if it is determined that the lowest resonant frequency is not greater than the expected uncoupled resonant frequency, object sensing method 900 proceeds to operation 922. In operation 922, object sensing method 900 selects the lowest Q-factor transmit coil to transmit power to a receive coil of a wireless power receiver, and object sensing method 900 proceeds to operation 924 (implying that a receive coil is determined to be proximate to the transmit coils). In operation 924, object sensing method 900 transmits the wireless power to the receive coil using the selected lowest Q-factor transmit coil.

It should be understood that the controller 210 of FIG. 2 may be configured to implement the data collection method 700 of FIG. 7, the data processing method 800 of FIG. 8, and the object sensing method 900 of FIG. 9.

Figure 10:
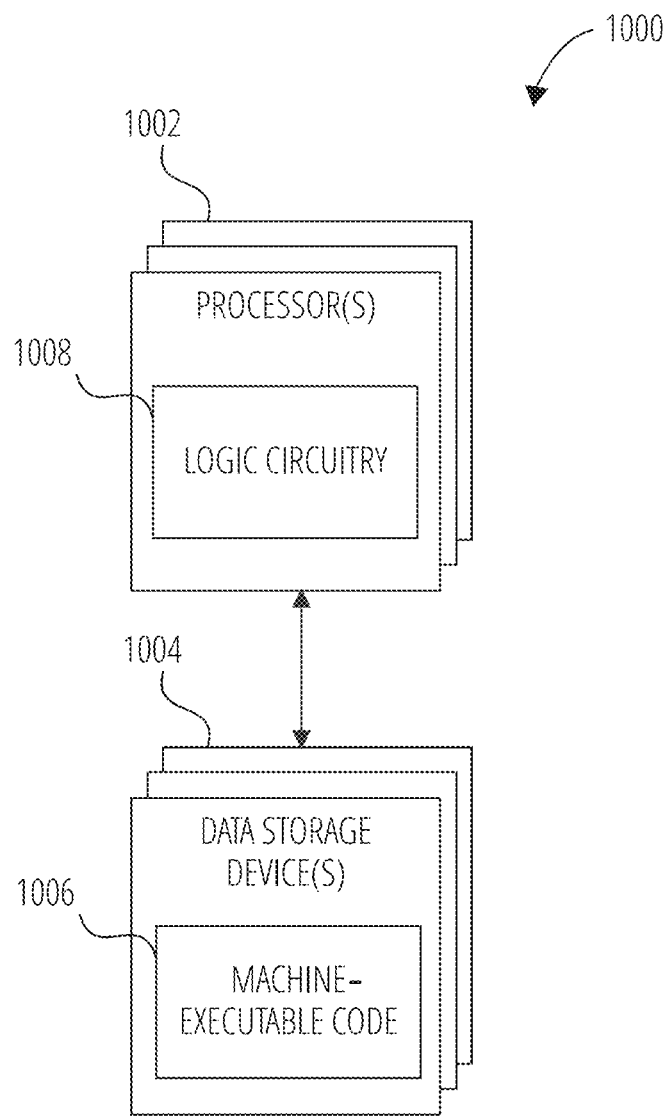
FIG. 10 is a block diagram of circuitry that, in some embodiments, may be used to implement various functions, operations, acts, processes, and/or methods disclosed herein.

It will be appreciated by those of ordinary skill in the art that functional elements of embodiments disclosed herein (e.g., functions, operations, acts, processes, and/or methods) may be implemented in any suitable hardware, software, firmware, or combinations thereof. FIG. 10 illustrates non-limiting examples of implementations of functional elements disclosed herein. In some embodiments, some or all portions of the functional elements disclosed herein may be performed by hardware specially configured for carrying out the functional elements.

FIG. 10 is a block diagram of circuitry 1000 that, in some embodiments, may be used to implement various functions, operations, acts, processes, and/or methods disclosed herein. The circuitry 1000 includes one or more processors 1002 (sometimes referred to herein as "processors 1002") operably coupled to one or more data storage devices (sometimes referred to herein as "storage 1004"). The storage 1004 includes machine-executable code 1006 stored thereon and the processors 1002 include logic circuitry 1008. The machine-executable code 1006 includes information describing functional elements that may be implemented by (e.g., performed by) the logic circuitry 1008. The logic circuitry 1008 is adapted to implement (e.g., perform) the functional elements described by the machine-executable code 1006. The circuitry 1000, when executing the functional elements described by the machine-executable code 1006, should be considered as special purpose hardware configured for carrying out functional elements disclosed herein. In some embodiments, the processors 1002 may be configured to perform the functional elements described by the machine-executable code 1006 sequentially, concurrently (e.g., on one or more different hardware platforms), or in one or more parallel process streams.

When implemented by logic circuitry 1008 of the processors 1002, the machine-executable code 1006 is configured to adapt the processors 1002 to perform operations of embodiments disclosed herein. For example, the machine-executable code 1006 may be configured to adapt the processors 1002 to perform at least a portion or a totality of the data collection method 700 of FIG. 7, the data processing method 800 of FIG. 8, and/or the object sensing method 900 of FIG. 9. As another example, the machine-executable code 1006 may be configured to adapt the processors 1002 to perform at least a portion or a totality of the operations discussed for the controller 210 of FIG. 2. As a further example, the machine-executable code 1006 may be configured to adapt the processors 1002 to perform at least a portion or a totality of the operations discussed for the processing core 236 of FIG. 2. As a specific, non-limiting example, the machine-executable code 1006 may be configured to adapt the processors 1002 to perform at least a portion of the object detection operations discussed herein.

The processors 1002 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is configured to execute functional elements corresponding to the machine-executable code 1006 (e.g., software code, firmware code, hardware descriptions) related to embodiments of the present disclosure. It is noted that a general-purpose processor (may also be referred to herein as a host processor or simply a host) may be a microprocessor, but in the alternative, the processors 1002 may include any conventional processor, controller, microcontroller, or state machine. The processors 1002 may also be implemented as a combination of computing devices, such as a combination of a DSP and a microprocessor, a plurality of microprocessors, one or more microprocessors in conjunction with a DSP core, or any other such configuration.

In some embodiments, the storage 1004 includes volatile data storage (e.g., random-access memory (RAM)), non-volatile data storage (e.g., Flash memory, a hard disc drive, a solid-state drive, erasable programmable read-only memory (EPROM), etc.). In some embodiments, the processors 1002 and the storage 1004 may be implemented into a single device (e.g., a semiconductor device product, a system on chip (SOC), etc.). In some embodiments, the processors 1002 and the storage 1004 may be implemented into separate devices.

In some embodiments, the machine-executable code 1006 may include computer-readable instructions (e.g., software code, firmware code). By way of non-limiting example, the computer-readable instructions may be stored by the storage 1004, accessed directly by the processors 1002, and executed by the processors 1002 using at least the logic circuitry 1008. Also, by way of non-limiting example, the computer-readable instructions may be stored on the storage 1004, transferred to a memory device (not shown) for execution, and executed by the processors 1002 using at least the logic circuitry 1008. Accordingly, in some embodiments, the logic circuitry 1008 includes electrically configurable logic circuitry 1008.

In some embodiments, the machine-executable code 1006 may describe hardware (e.g., circuitry) to be implemented in the logic circuitry 1008 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, VERILOG™, SYSTEMVERILOG™ or very large-scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 1008 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some embodiments, the machine-executable code 1006 may include an HDL, an RTL, a GL description, a mask level description, other hardware description, or any combination thereof.

In embodiments where the machine-executable code 1006 includes a hardware description (at any level of abstraction), a system (not shown, but including the storage 1004) may be configured to implement the hardware description described by the machine-executable code 1006. By way of non-limiting example, the processors 1002 may include a programmable logic device (e.g., an FPGA or a PLC) and the logic circuitry 1008 may be electrically controlled to implement circuitry corresponding to the hardware description into the logic circuitry 1008. Also, by way of non-limiting example, the logic circuitry 1008 may include hard-wired logic manufactured by a manufacturing system (not shown, but including the storage 1004) according to the hardware description of the machine-executable code 1006.

Regardless of whether the machine-executable code 1006 includes computer-readable instructions or a hardware description, the logic circuitry 1008 is adapted to perform the functional elements described by the machine-executable code 1006 when implementing the functional elements of the machine-executable code 1006. It is noted that although a hardware description may not directly describe functional elements, a hardware description indirectly describes functional elements that the hardware elements described by the hardware description are capable of performing.

EXAMPLES

A non-exhaustive, non-limiting list of example embodiments follows. Not each of the example embodiments listed below is explicitly and individually indicated as being combinable with all others of the example embodiments listed below and embodiments discussed above. It is intended, however, that these example embodiments are combinable with all other example embodiments and embodiments discussed above unless it would be apparent to one of ordinary skill in the art that the embodiments are not combinable.

Example 1: A controller for a wireless power transmitter, the controller comprising: a measurement voltage potential input configured to receive a measurement voltage potential responsive to a tank circuit signal at a tank circuit of the wireless power transmitter, the tank circuit including a plurality of transmit coils; a coil select output configured to provide one or more coil select signals, the one or more coil select signals configured to selectively control which of the plurality of transmit coils conducts an alternating current (AC) signal provided to the plurality of transmit coils; and a processing core configured to: control the one or more coil select signals to provide the AC signal to each of the plurality of transmit coils one at a time; determine at least one of a resonant frequency and a quality factor (Q-factor) of the tank circuit responsive to each selected transmit coil of the plurality of transmit coils; and select a transmit coil from the plurality of transmit coils to use to transmit wireless power to a receive coil of a wireless power receiver responsive to the determined at least one of the resonant frequency and the Q-factor for each transmit coil of the plurality of transmit coils.

Example 2: The controller of Example 1, further comprising an AC control output configured to provide one or more AC control signals, the one or more AC control signals configured to control the AC signal applied to the plurality of transmit coils.

Example 3: The controller according to any one of Examples 1 and 2, further comprising a temperature input configured to receive a temperature signal corresponding to a temperature of the wireless power transmitter, wherein the processing core is further configured to calibrate the determined at least one of the resonant frequency and the Q-factor of the tank circuit responsive to the temperature signal.

Example 4: A wireless power transmitter, comprising: an H-bridge inverter including a first node and a second node; a plurality of transmit coils; a transmit capacitor electrically connected between the first node of the H-bridge inverter and the plurality of transmit coils; and a plurality of coil switches, each of the plurality of coil switches electrically connected between a respective one of the plurality of transmit coils and the second node of the H-bridge inverter.

Example 5: The wireless power transmitter of Example 4, further comprising a controller electrically connected to the H-bridge inverter and the plurality of coil switches, the controller configured to periodically control the wireless power transmitter to perform an object detection operation.

Example 6: The wireless power transmitter of Example 5, wherein the object detection operation includes a data collection operation wherein the controller is configured to: set a coil number equal to a first number, each transmit coil of the plurality of transmit coils associated with a number from the first number to a last number; close a coil switch of the plurality of coil switches associated with the coil number to electrically connect the transmit coil associated with the first number to the H-bridge inverter; control the H-bridge inverter to provide an alternating current (AC) to a tank circuit, the tank circuit comprising the transmit coil of the plurality of transmit coils associated with the number; sample a measurement voltage potential responsive to a tank circuit signal; increment the coil number; and repeat the close, control, sample, and increment operations unless the incremented coil number is greater than the last number.

Example 7: The wireless power transmitter of Example 6, wherein the object detection operation also includes a data processing operation wherein the controller is configured to: set the coil number equal to the first number; identify peaks in the sampled measurement voltage potential associated with the coil number; calculate a quality factor (Q-factor) of the tank circuit associated with the coil number based, at least in part, on the identified peaks; determine a resonant frequency of the tank circuit associated with the coil number based, at least in part, on the identified peaks; increment the coil number; store the calculated Q-factor and the determined resonant frequency to one or more data storage devices; increment the coil number; and repeat the identify, calculate, determine, increment, store and increment operations unless the coil number is greater than the last number.

Example 8: The wireless power transmitter of Example 7, wherein the object detection operation also includes an object sensing operation wherein the controller is configured to determine whether a receive coil of a wireless power receiver, a foreign object, or nothing is located proximate to at least one of the plurality of transmit coils based at least in part on the stored Q-factor and the stored resonant frequency associated with each of the plurality of transmit coils.

Example 9: The wireless power transmitter according to any one of Examples 6-8, further comprising one or more temperature sensors electrically connected to the controller, the one or more temperature sensors configured to provide a temperature signal to the controller, wherein the controller is configured to calibrate measurements taken from the tank circuit based, at least in part on the temperature signal.

Example 10: A method of operating a wireless power transmitter, the method comprising: setting a coil number equal to a first number, each transmit coil of a plurality of transmit coils of the wireless power transmitter associated with a number from the first number to a last number; implementing a tank circuit with a transmit coil associated with the coil number; applying an alternating current (AC) signal to the tank circuit; determining whether the AC signal has completed application to the tank circuit; sampling a measurement voltage potential responsive to a tank circuit signal responsive to determining that the AC signal has completed; determining whether a number of samples collected for the measurement voltage potential has reached a predetermined number of samples; delaying for a predetermined period of time until the tank circuit has discharged; incrementing the coil number; and repeating the implementing, applying, determining, sampling, determining, delaying, and incrementing unless the incremented coil number is greater than the last number.

Example 11: The method of Example 10, wherein implementing the tank circuit with the transmit coil associated with the coil number includes closing a coil switch associated with the coil number to electrically connect the transmit coil associated with the coil number to an H-bridge inverter to implement the tank circuit.

Example 12: The method according to any one of Examples 10 and 11, wherein applying the AC signal to the tank circuit comprises enabling one or more AC control signals configured to control the AC signal.

Example 13: The method of Example 12, wherein enabling one or more AC control signals comprises enabling one or more pulse-width modulation signals configured to control an H-bridge inverter operably coupled to a direct current (DC) voltage source to generate the AC signal.

Example 14: The method according to any one of Examples 10-13, further comprising: setting the coil number equal to the first number; identifying peaks in the sampled measurement voltage potential associated with the coil number; calculating a quality factor (Q-factor) of the tank circuit associated with the coil number based, at least in part, on the identified peaks; determining a resonant frequency of the tank circuit associated with the coil number based, at least in part, on the identified peaks; incrementing the coil number; storing the calculated Q-factor and the determined resonant frequency to one or more data storage devices; and repeating the identifying, calculating, determining, incrementing, and storing unless the coil number is greater than the last number.

Example 15: The method of Example 14, further comprising: determining a lowest Q-factor of Q-factors stored to the one or more data storage devices; identifying a lowest Q-factor transmit coil associated with the lowest Q-factor; determining a lowest resonant frequency of resonant frequencies stored to the one or more data storage devices; identifying a lowest resonant frequency transmit coil associated with the lowest resonant frequency; determining whether the lowest Q-factor is less than a threshold minimum Q-factor value; determining whether the lowest resonant frequency is greater than an expected uncoupled resonant frequency of the tank circuit if it is determined that the lowest Q-factor is less than the threshold minimum Q-factor value; selecting the lowest Q-factor transmit coil to transmit power to a receive coil of a wireless power receiver if it is determined that the lowest resonant frequency is not greater than the expected uncoupled resonant frequency; and transmitting wireless power to the receive coil using the selected lowest Q-factor transmit coil if the lowest Q-factor transmit coil is selected.

Example 16: The method of Example 15, further comprising determining that a foreign object is located proximate to the one or more transmit coils if it is determined that the lowest resonant frequency is greater than the expected uncoupled resonant frequency.

Example 17: The method according to any one of Examples 15 and 16, further comprising determining whether the lowest resonant frequency is less than a threshold minimum resonant frequency if it is determined that the lowest Q-factor is not less than the threshold minimum Q-factor; selecting the lowest resonant frequency transmit coil to transmit power to the receive coil if it is determined that the lowest resonant frequency is less than the threshold minimum resonant frequency; and transmitting the wireless power to the receive coil using the selected lowest resonant frequency transmit coil if the lowest resonant frequency transmit coil is selected.

Example 18: The method according to any one of Examples 15-17, further comprising entering a sleep mode if it is determined that the lowest resonant frequency is not less than the threshold minimum resonant frequency or if it is determined that the lowest resonant frequency is greater than the expected uncoupled resonant frequency.

Example 19: A controller for a wireless power transmitter, the controller comprising: a coil voltage potential input configured to receive a coil voltage potential responsive to a tank circuit voltage potential at a tank circuit of the wireless power transmitter, the tank circuit including a plurality of transmit coils; a coil select output configured to provide one or more coil select signals, the one or more coil select signals configured to selectively control which of the plurality of transmit coils conducts an alternating current (AC) signal provided to the plurality of transmit coils; and a processing core configured to: control the one or more coil select signals to provide the AC signal to each of the plurality of transmit coils one at a time; determine at least one of a resonant frequency and a quality factor (Q-factor) of the tank circuit responsive to each selected transmit coil of the plurality of transmit coils; and select a transmit coil from the plurality of transmit coils to use to transmit wireless power to a receive coil of a wireless power receiver responsive to the determined at least one of the resonant frequency and the Q-factor for each transmit coil of the plurality of transmit coils.

Example 20: The controller of Example 19, further comprising an AC control output configured to provide one or more AC control signals, the one or more AC control signals configured to control the AC signal applied to the plurality of transmit coils.

Example 21: The controller according to any one of Examples 19 and 20, further comprising a temperature input configured to receive a temperature signal corresponding to a temperature of the wireless power transmitter.

Example 22: The controller of Example 21, wherein the processing core is further configured to calibrate the determined at least one of the resonant frequency and the Q-factor of the tank circuit responsive to the temperature signal.

Example 23: A wireless power transmitter, comprising: an H-bridge inverter including a first node and a second node; a plurality of transmit coils; a transmit capacitor electrically connected between the first node of the H-bridge inverter and the plurality of transmit coils; and a plurality of coil switches, each of the plurality of coil switches electrically connected between one of the plurality of transmit coils and the second node of the H-bridge inverter.

Example 24: The wireless power transmitter of Example 23, further comprising a controller electrically connected to the H-bridge inverter and the plurality of coil switches, the controller configured to periodically control the wireless power transmitter to perform an object detection operation.

Example 25: The wireless power transmitter of Example 24, wherein the object detection operation includes a data collection operation wherein the controller is configured to: set a coil number equal to a first number, each transmit coil of a plurality of transmit coils associated with a number from the first number to a last number; close a coil switch associated with the coil number to electrically connect a transmit coil associated with the first number to the H-bridge inverter; control the H-bridge inverter to provide an alternating current (AC) to a tank circuit; sample a coil voltage potential responsive to a voltage potential at the tank circuit; increment the coil number; and repeat the close, control, sample, and increment operations unless the incremented coil number is greater than the last number.

Example 26: The wireless power transmitter of Example 25, wherein the object detection operation also includes a data processing operation wherein the controller is configured to: set the coil number equal to the first number; identify peaks in the sampled coil voltage potential associated with the coil number; calculate a quality factor (Q-factor) of the tank circuit associated with the coil number based, at least in part, on the identified peaks; determine a resonant frequency of the tank circuit associated with the coil number based, at least in part, on the identified peaks; increment the coil number; store the calculated Q-factor and the determined resonant frequency to one or more data storage devices; and repeat the identify, calculate, determine, increment, and store operations unless the coil number is greater than the last number.

Example 27: The wireless power transmitter of Example 26, wherein the object detection operation also includes an object sensing operation wherein the controller is configured to determine whether a receiver coil of a wireless power receiver, a foreign object, or nothing is located proximate to at least one of the plurality of transmit coils based at least in part on the stored Q-factor and the stored resonant frequency associated with each of the plurality of transmit coils.

Example 28: The wireless power transmitter according to any one of Examples 24-27, further comprising one or more temperature sensors electrically connected to the controller, the one or more temperature sensors configured to provide a temperature signal to the controller, wherein the controller is configured to calibrate measurements taken from the plurality of transmit coils based, at least in part on the temperature signal.

Example 29: A method of operating a wireless power transmitter, the method comprising: setting a coil number equal to a first number, each transmit coil of a plurality of transmit coils of the wireless power transmitter associated with a number from the first number to a last number; closing a coil switch associated with the coil number to electrically connect a transmit coil associated with the coil number to an H-bridge inverter to implement a tank circuit including the transmit coil and a transmit capacitor; applying an alternating current (AC) signal to the tank circuit; determining whether the AC signal has completed application to the tank circuit; sampling a coil voltage potential responsive to a voltage potential at the tank circuit responsive to determining that the AC signal has completed; determining whether a number of samples collected for the coil voltage potential has reached a predetermined number of samples; delaying for a predetermined period of time until the tank circuit has discharged; incrementing the coil number; and repeating the closing, applying, determining, sampling, determining, delaying, and incrementing unless the incremented coil number is greater than the last number.

Example 30: The method of Example 29, wherein applying the AC signal to the tank circuit comprises enabling one or more AC control signals configured to control the AC signal.

Example 31: The method of Example 30, wherein enabling one or more AC control signals comprises enabling one or more pulse-width modulation signals configured to control an H-bridge inverter operably coupled to a direct current (DC) voltage source to generate the AC signal.

Example 32: A method according to any one of Examples 29-31, further comprising: setting the coil number equal to the first number; identifying peaks in the sampled coil voltage potential associated with the coil number; calculating a quality factor (Q-factor) of the tank circuit associated with the coil number based, at least in part, on the identified peaks; determining a resonant frequency of the tank circuit associated with the coil number based, at least in part, on the identified peaks; incrementing the coil number; storing the calculated Q-factor and the determined resonant frequency to one or more data storage devices; and repeating the identifying, calculating, determining, incrementing, and storing unless the coil number is greater than the last number.

Example 33: The method of Example 32, further comprising: determining a lowest Q-factor of Q-factors stored to the one or more data storage devices; identifying a lowest Q-factor transmit coil associated with the lowest Q-factor; determining a lowest resonant frequency of resonant frequencies stored to the one or more data storage devices; identifying a lowest resonant frequency transmit coil associated with the lowest resonant frequency; determining whether the lowest Q-factor is less than a threshold minimum Q-factor value; determining whether the lowest resonant frequency is greater than an expected uncoupled resonant frequency of the tank circuit if it is determined that the lowest Q-factor is less than the threshold minimum Q-factor value; selecting the lowest Q-factor transmit coil to transmit power to a receive coil of a wireless power receiver if it is determined that the lowest resonant frequency is not greater than the expected uncoupled resonant frequency; transmitting wireless power to the receive coil using the selected lowest Q-factor transmit coil if the lowest Q-factor transmit coil is selected; determining that a foreign object is located proximate to the one or more transmit coils if it is determined that the lowest resonant frequency is greater than the expected uncoupled resonant frequency; determining whether the lowest resonant frequency is less than a threshold minimum resonant frequency if it is determined that the lowest Q-factor is not less than the threshold minimum Q-factor; selecting the lowest resonant frequency transmit coil to transmit power to the receive coil if it is determined that the lowest resonant frequency is less than the threshold minimum resonant frequency; transmitting the wireless power to the receive coil using the selected lowest resonant frequency transmit coil if the lowest resonant frequency transmit coil is selected; and entering a sleep mode if it is determined that a minimum frequency is not less than the threshold minimum resonant frequency or if it is determined that the foreign object is located proximate to one or more transmit coils.

CONCLUSION

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
   a terminal to receive a measurement voltage potential at least partially responsive to a tank circuit signal at a tank circuit of a wireless power transmitter, the tank circuit including a plurality of transmit coils; and
   a processing core to:
      control provision of an alternating current (AC) signal to charge each of the plurality of transmit coils one at a time; and
      select a transmit coil from the plurality of transmit coils to use to transmit wireless power to a receive coil of a wireless power receiver responsive to at least one of a resonant frequency and a Q-factor for each transmit coil of the plurality of transmit coils determined in absence of the AC signal after completion of provision of the AC signal to the tank circuit.

2. The apparatus of claim 1, wherein the processing core to:
   determine both the resonant frequency and the Q-factor of the tank circuit responsive to discharge of each selected transmit coil of the plurality of transmit coils in the absence of the AC signal after the completion of the provision of the AC signal to the tank circuit.

3. The apparatus of claim 1, wherein the processing core to:
   identify a lowest Q-factor transmit coil of the plurality of transmit coils associated with a lowest determined Q-factor value; and
   identify a lowest resonant frequency transmit coil associated with a lowest determined resonant frequency value.

4. The apparatus of claim 3, wherein the processing core to:
   determine that a foreign object is located proximate to one or more transmit coils of the plurality of transmit coils at least partially responsive to:
   a determination that the lowest determined Q-factor value is less than a threshold minimum Q-factor value; and
   a determination that the lowest determined resonant frequency value is greater than an expected uncoupled resonant frequency.

5. The apparatus of claim 4, wherein the processing core to:
   enter a sleep mode responsive to a determination that the foreign object is located proximate to the one or more transmit coils.

6. The apparatus of claim 3, wherein the processing core to:
   determine that a proximity of the one or more transmit coils of the plurality of transmit coils is free of foreign objects and receive coils at least partially responsive to:
   a determination that the lowest determined Q-factor value is not less than a threshold minimum Q-factor value; and
   a determination that the lowest determined resonant frequency value is not less than a threshold minimum resonant frequency value.

7. The apparatus of claim 6, wherein the processing core to:
   enter a sleep mode at least partially responsive to a determination that the proximity of the one or more transmit coils is free of foreign objects and receive coils.

8. The apparatus of claim 3, wherein the processing core to:
   select the identified lowest Q-factor transmit coil to transmit the wireless power to the receive coil at least partially responsive to:
   a determination that the lowest determined Q-factor value is less than a threshold minimum Q-factor value; and
   a determination that the lowest determined resonant frequency value is not greater than an expected uncoupled resonant frequency.

9. The apparatus of claim 3, wherein the processing core to:
   select the lowest resonant frequency transmit coil to transmit the wireless power to the receive coil at least partially responsive to:
   a determination that the lowest determined Q-factor value is not less than a threshold minimum Q-factor value; and
   a determination that the lowest determined resonant frequency value is less than a threshold minimum resonant frequency value.

10. The apparatus of claim 3, wherein the processing core to:

determine that the receive coil is proximate to the plurality of transmit coils at least partially responsive to each one of:
  determinations that both the lowest determined Q-factor value is less than a threshold minimum Q-factor value and the lowest determined resonant frequency value is not greater than an expected uncoupled resonant frequency; and
  determinations that both the lowest determined Q-factor value is not less than a threshold minimum Q-factor value and the lowest determined resonant frequency value is less than a threshold minimum resonant frequency value.

11. The apparatus of claim 1, wherein a selected transmit coil to transmit the wireless power to the receive coil responsive to a selection, by the processing core, of the selected transmit coil.

12. The apparatus of claim 1, wherein the processing core to:
  determine the at least one of the resonant frequency and the Q-factor of the tank circuit based, at least in part, on identified peaks of the measurement voltage potential responsive to discharge of each selected transmit coil of the plurality of transmit coils in the absence of the AC signal after the completion of the provision of the AC signal to the tank circuit.

13. A method of operating a controller for a wireless power transmitter, the method comprising:
  sampling a measurement voltage potential responsive to a tank circuit signal at a tank circuit of the wireless power transmitter, the tank circuit including a plurality of transmit coils;
  provisioning an alternating current (AC) signal to charge each of the plurality of transmit coils one at a time; and
  selecting a transmit coil from the plurality of transmit coils to use to transmit wireless power to a receive coil of a wireless power receiver responsive to at least one of a resonant frequency and a Q-factor for each transmit coil of the plurality of transmit coils determined in absence of the AC signal after completion of provision of the AC signal to the tank circuit.

14. The method of claim 13, comprising:
  determining the resonant frequency and the Q-factor of the tank circuit at least partially responsive to discharge of each selected transmit coil of the plurality of transmit coils in the absence of the AC signal after the completion of the provision of the AC signal to the tank circuit.

15. The method of claim 13, comprising entering a sleep mode at least partially responsive to a determination that a foreign object is located proximate to one or more transmit coils of the plurality of transmit coils.

16. The method of claim 13, comprising entering a sleep mode at least partially responsive to a determination that a proximity of one or more transmit coils of the plurality of transmit coils is free of foreign objects and receive coils.

17. The method of claim 13, comprising controlling a selected transmit coil to transmit the wireless power to the receive coil at least partially responsive to the selecting of the selected transmit coil.

18. The method of claim 13, comprising determining the at least one of the resonant frequency and the Q-factor of the tank circuit based, at least in part, on identified peaks of the measurement voltage potential responsive to discharge of each selected transmit coil of the plurality of transmit coils in the absence of the AC signal after the completion of the provision of the AC signal to the tank circuit.

19. The method of claim 18, comprising identifying the identified peaks of the measurement voltage potential.

20. The method of claim 13, wherein providing the AC signal to charge each of the plurality of transmit coils one at a time comprises controlling one or more coil select signals to select the plurality of transmit coils one at a time.

* * * * *